United States Patent
Marschalkowski et al.

(10) Patent No.: US 10,241,526 B2
(45) Date of Patent: Mar. 26, 2019

(54) THERMOSTAT SWITCHING CIRCUITRY WITH OVERCURRENT SHUTDOWN

(71) Applicant: Google LLC, Mountain View, CA (US)

(72) Inventors: Eric Marschalkowski, Munich (DE); Orville Buenaventura, Palo Alto, CA (US); Daniel Adam Warren, San Francisco, CA (US)

(73) Assignee: Google LLC, Mountain View, CA (US)

( * ) Notice: Subject to any disclaimer, the term of this patent is extended or adjusted under 35 U.S.C. 154(b) by 266 days.

(21) Appl. No.: 15/349,809

(22) Filed: Nov. 11, 2016

(65) Prior Publication Data
US 2018/0136675 A1    May 17, 2018

(51) Int. Cl.
| | |
|---|---|
| *G05D 23/19* | (2006.01) |
| *G01R 19/15* | (2006.01) |
| *H02H 3/00* | (2006.01) |
| *H02H 3/06* | (2006.01) |
| *H02M 1/08* | (2006.01) |

(52) U.S. Cl.
CPC ............. *G05D 23/19* (2013.01); *G01R 19/15* (2013.01); *H02H 3/00* (2013.01); *H02H 3/063* (2013.01); *H02M 1/083* (2013.01)

(58) Field of Classification Search
CPC ......... H02H 3/00; H02H 3/063; H02M 1/083; G05D 23/19; G01R 19/15
USPC ........................................................ 361/93.1
See application file for complete search history.

(56) References Cited

U.S. PATENT DOCUMENTS

| | | | |
|---|---|---|---|
| 2008/0094010 A1* | 4/2008 | Black ................... | H02M 5/293 315/307 |
| 2014/0175181 A1* | 6/2014 | Warren ................. | G05D 23/19 236/51 |

* cited by examiner

*Primary Examiner* — Kevin J Comber
(74) *Attorney, Agent, or Firm* — Kilpatrick Townsend & Stockton LLP

(57) ABSTRACT

A thermostat may include HVAC wire connectors that receive a call relay wire and a power return wire, switching elements having a first operating state in which they create a connection between the call relay wire and the power return wire and a second operating state in which the connection between the call relay wire and the power return wire is interrupted. The thermostat may also include control circuitry configured to cause the switching elements to operate in the first operating state to actuate an HVAC function; detect an anomaly associated with measurements from power monitoring circuitry; cause the switching elements to continue to operate in the first operating state until a zero-crossing is detected; and then cause the one or more switching elements to operate in the second operating state.

20 Claims, 29 Drawing Sheets

THERMOSTAT SWITCHING CIRCUITRY WITH OVERCURRENT SHUTDOWN

TECHNICAL FIELD

This patent specification relates to systems, methods, and related computer program products for the monitoring and control of energy-consuming systems or other resource-consuming systems. More particularly, this patent specification relates to monitoring and recoverable protection of thermostat circuitry.

BACKGROUND

During the installation or subsequent upgrade of an HVAC system, there are occasions when wires may be incorrectly connected to various components of the HVAC system, including an electronic thermostat. When wires are incorrectly connected to a thermostat, there is the possibility for a short circuit to be created that if not accounted for could result in permanent damage to either the thermostat, the HVAC wiring and/or other HVAC system components. In order to protect against such conditions, the electronic thermostat can include one or more fuses that are designed to blow under the increased current of a short circuit condition. However, blown fuses are problematic from support and customer satisfaction viewpoint. The problem of blown fuses can be particularly problematic for thermostats that are intended to be user-installable.

BRIEF SUMMARY

A further understanding of the nature and advantages of the present invention may be realized by reference to the remaining portions of the specification and the drawings. Also note that other embodiments may be described in the following disclosure and claims.

In some embodiments, a thermostat may include a plurality of wire connectors configured to receive a plurality of wires from an environmental control system, the plurality of wire connectors comprising a call relay wire connector and a power return wire connector. The thermostat may also include one or more solid-state switching elements coupled to the call relay wire connector and the power return wire connector. The one or more solid-state switching elements may have a first operating state in which the one or more solid-state switching elements create a connection between the call relay wire connector and the power return wire connector. The one or more solid-state switching elements may also have a second operating state in which the connection between the call relay wire connector and the power return wire connector is interrupted. The thermostat may additionally include a zero-crossing detection circuit that detects when an electrical signal of the one or more solid-state switching elements is zero. The thermostat may further include power monitoring and control circuitry coupled to the one or more solid-state switching elements and configured to cause the one or more solid-state switching elements to operate in the first operating state to actuate at least one environmental control function; measure the electrical signal of the one or more solid-state switching elements when the one or more solid-state switching elements are operating in the first operating state; detect an anomaly associated with the electrical signal; in response to detecting the anomaly, store an indication that the anomaly occurred while continuing to cause the one or more solid-state switching elements to operate in the first operating state; receive an indication from the zero-crossing detection circuit that the electrical signal of the one or more solid-state switching elements is zero; and in response to receiving the indication from the zero-crossing detection circuit, cause the one or more solid-state switching elements to operate in the second operating state.

In some embodiments, a method of responding to electrical anomalies by a thermostat may include causing one or more solid-state switching elements of the thermostat to operate in a first operating state to actuate at least one environmental control function. The one or more solid-state switching elements may be coupled to a call relay wire connector and a power return wire connector of the thermostat. The one or more solid-state switching elements may be configured to operate in the first operating state in which the one or more solid-state switching elements create a connection between the call relay wire connector and the power return wire connector. The one or more solid-state switching elements may be configured to operate in a second operating state in which the connection between the call relay wire connector and the power return wire connector is interrupted. The method may also include measuring an electrical signal of the one or more solid-state switching elements when the one or more solid-state switching elements are operating in the first operating state, and detecting an anomaly associated with the electrical signal. The method may additionally include, in response to detecting the anomaly, storing an indication that the anomaly occurred while continuing to cause the one or more solid-state switching elements to operate in the first operating state. The method may further include receiving an indication from a zero-crossing detection circuit that the electrical signal of the one or more solid-state switching elements is zero, and in response to receiving the indication from the zero-crossing detection circuit, causing the one or more solid-state switching elements to operate in the second operating state.

In any of the embodiments described herein, one or more of the following features may be implemented in any combination and without limitation. The power monitoring and control circuitry may be further configured to after detecting the anomaly, and before receiving the indication from the zero-crossing detection circuit, dynamically adjusting an on-resistance of the one or more solid-state switching elements to maintain the electrical signal of the one or more solid-state switching elements below a predetermined threshold. The power monitoring and control circuitry may include an amplifier that receives electrical signal measurements through the one or more solid-state switching elements, measures a difference between the electrical signal and the predetermined threshold, and dynamically adjusts a control voltage applied to the one or more solid-state switching elements. The call relay wire connector and the power return wire connector may be connected to an inductive load of the environmental control system. An on-resistance of the one or more solid-state switching elements may be at least 10 times a resistance of the inductive load of the environmental control system. The power monitoring and control circuitry may include a first integrated circuit (IC) including a microprocessor, and a second IC including power monitoring circuitry, the one or more solid-state switching elements, and a drive circuit for the one or more solid-state switching elements. The second IC may be isolated from other circuitry in the thermostat through one or more isolation capacitors, where the second IC and the first IC may communicate with each other using clocked pulses. The second IC may be powered by the clocked pulses provided by the first IC. The anomaly associated with the electrical signal may include a current running through the one or more solid-state switching elements exceeding a threshold of approximately 4.0 A. The one or more solid-state switching elements may include a pair of complementary metal-oxide semiconductor field-effect transistors. The power monitoring and control circuitry of the thermostat may include a first terminal and a second terminal associated with the one or more solid-state switching elements, where the anomaly is detected by monitoring a voltage difference between the first terminal and the second terminal. The power monitoring and control circuitry of the thermostat may be further configured to send an indication of the anomaly to a remotely-located thermostat monitoring server.

DETAILED DESCRIPTION OF THE INVENTION

The Smart-Home Environment

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

Figure 1:
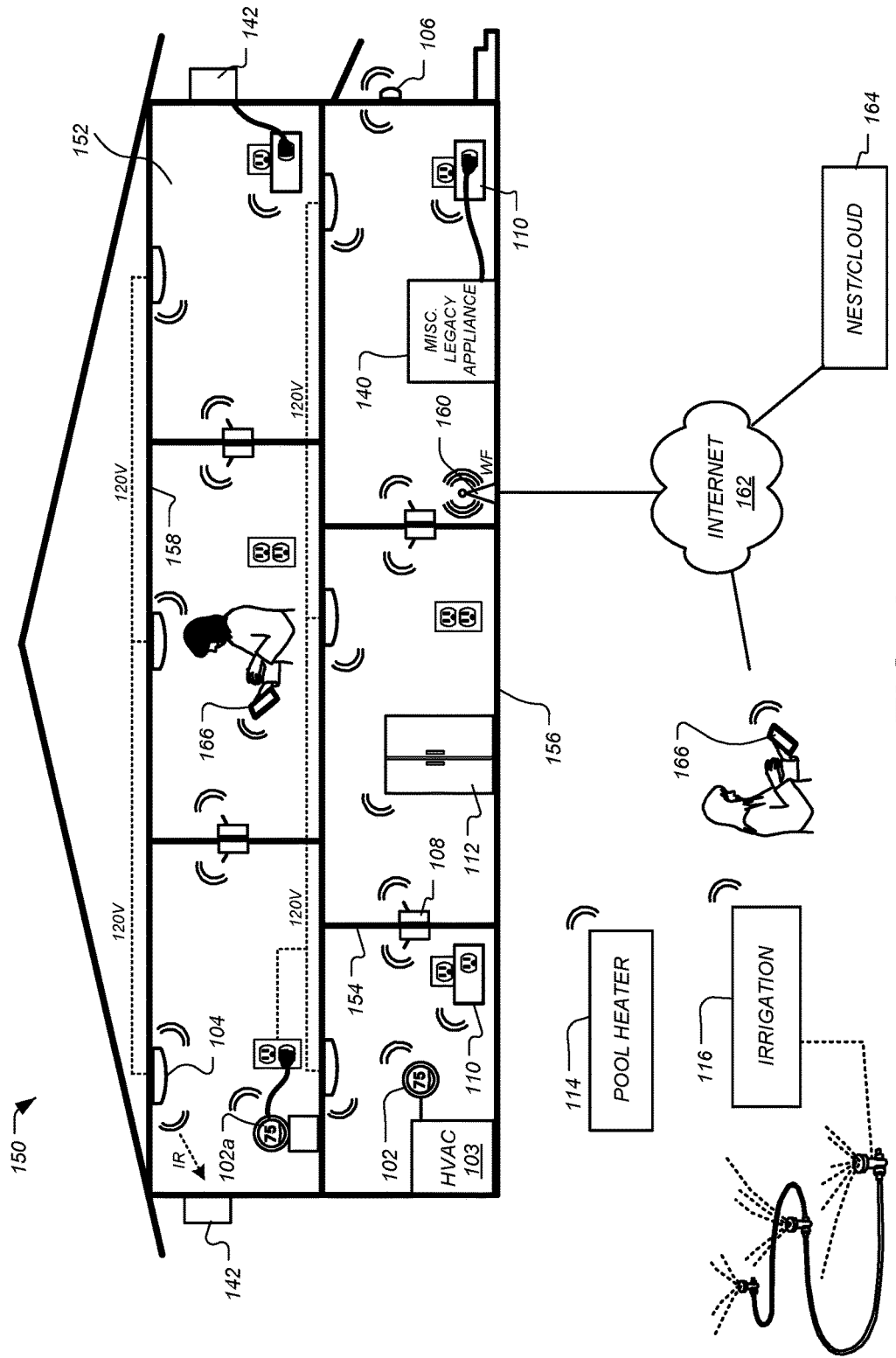
FIG. 1 illustrates an example of a smart home environment within which one or more of the devices, methods, systems, services, and/or computer program products described further herein can be applicable.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, Thread, Bluetooth, BLE, HomeKit Accessory Protocol (HAP), Weave, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
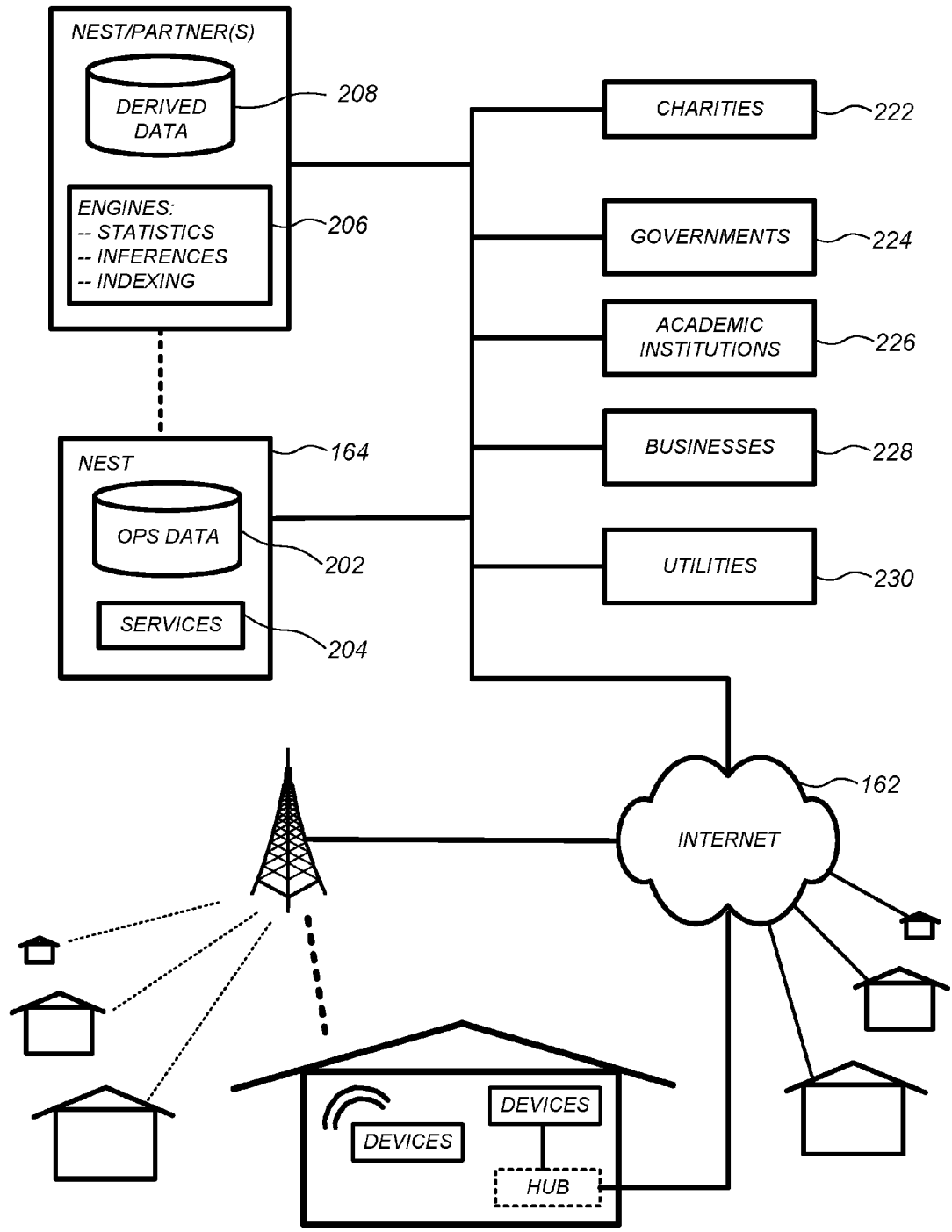
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
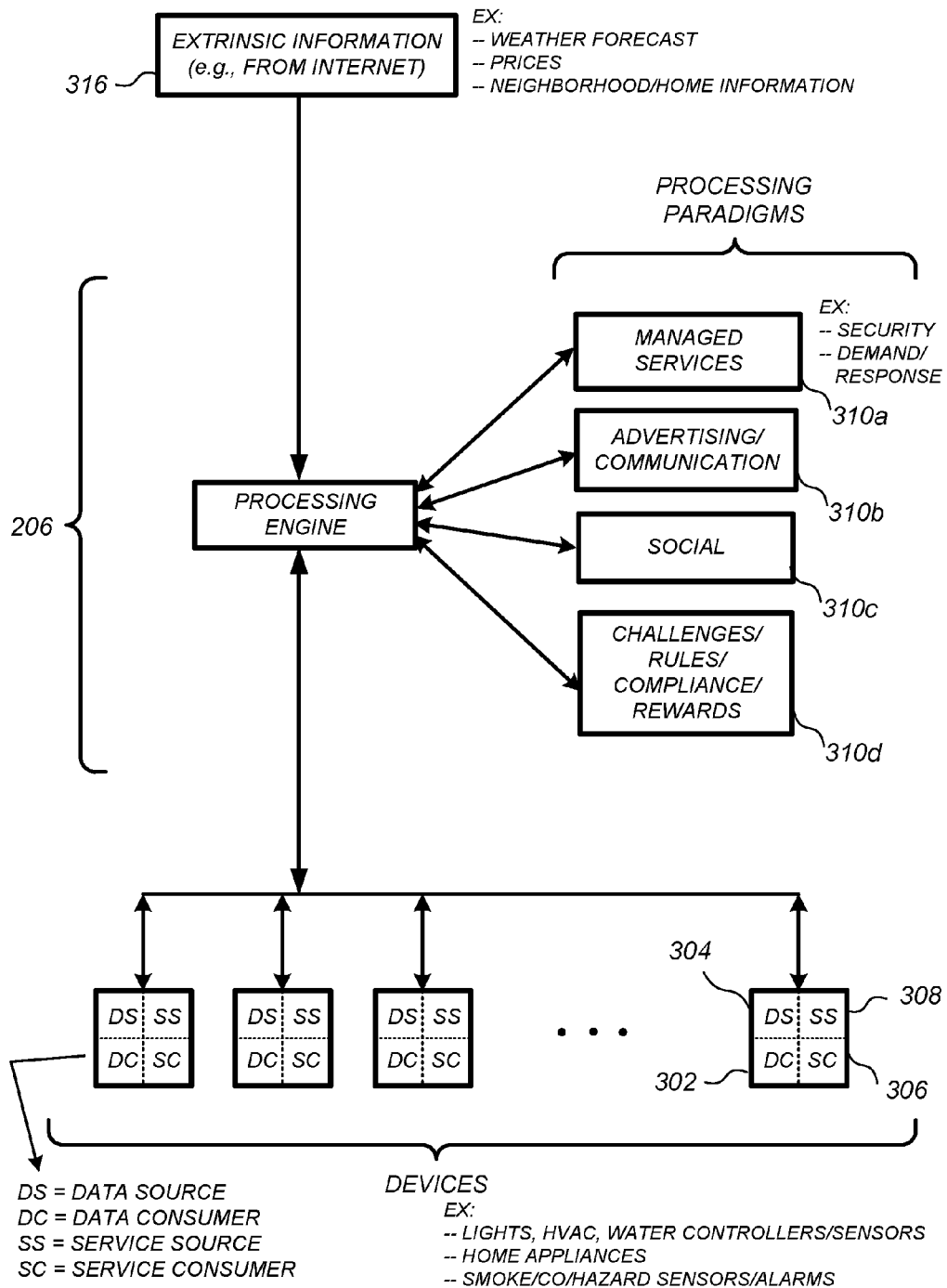
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage.

Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
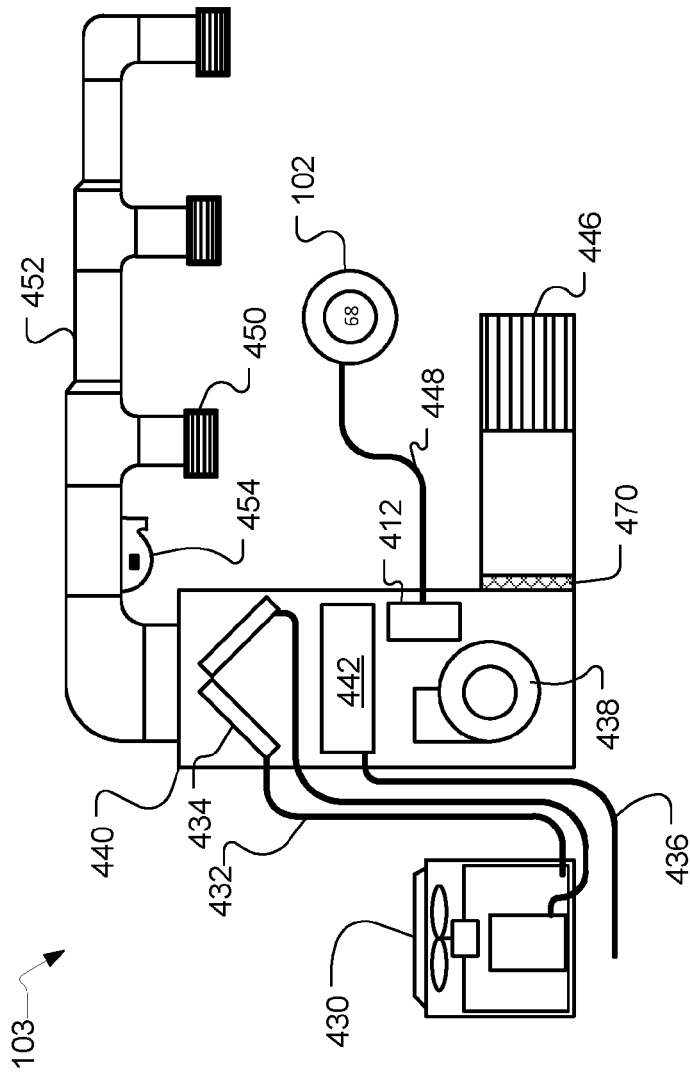
FIG. 4 illustrates a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a refrigerant gas through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

The Smart-Home Thermostat

Figure 5A:
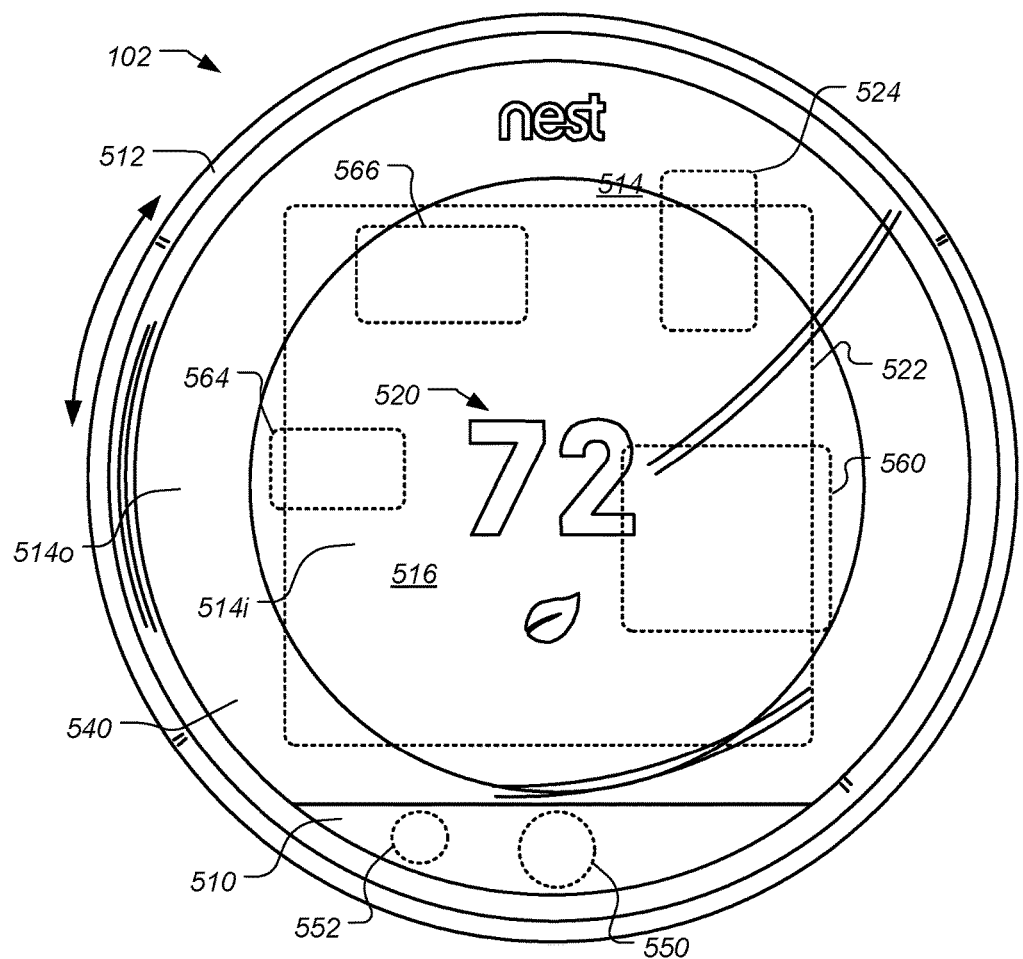
FIG. 5A-5B illustrate a thermostat having a visually pleasing, smooth, sleek and rounded exterior appearance while at the same time including one or more sensors for detecting occupancy and/or users, according to some embodiments.
Figure 5B:
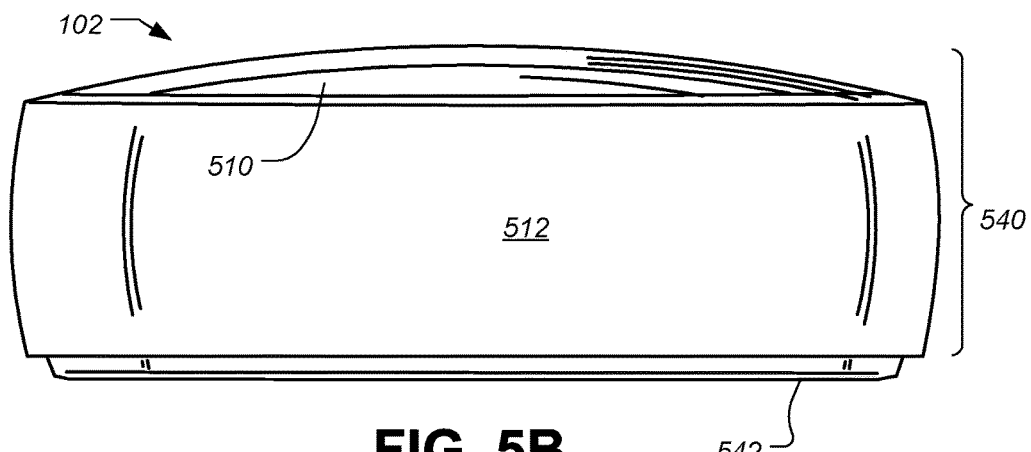

FIGS. 5A-5B illustrate a thermostat having a rounded exterior appearance and including one or more sensors for detecting environmental conditions, such as occupancy and/or users, temperature, ambient light, humidity, and so forth. FIG. 5A is front view, and FIG. 5B is a bottom elevation view of thermostat 102. Unlike many prior art thermostats, thermostat 102 has a simple and elegant design. Moreover, user interaction with thermostat 102 is facilitated and greatly enhanced over known conventional thermostats. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 has a large convex rounded front face lying inside the outer rotatable ring 512. According to some embodiments, thermostat 102 is approximately 84 mm in diameter and protrudes from the wall, when wall mounted, by 30 mm. The outer rotatable ring 512 allows the user to make adjustments, such as selecting a new setpoint temperature. For example, by rotating the outer ring 512 clockwise, the real-time (i.e. currently active) setpoint temperature can be increased, and by rotating the outer ring 512 counter-clockwise, the real-time setpoint temperature can be decreased.

The front face of the thermostat 102 comprises a cover 514 that according to some embodiments is polycarbonate, and a lens 510 having an outer shape that matches the contours of the curved outer front face of the thermostat 102. According to some embodiments, Fresnel lens elements may are formed on the interior surface of the lens 510 such that they are not obviously visible by viewing the exterior of the thermostat 102. Behind the lens 510 is a passive infrared (PIR) sensor 550 for detecting occupancy, a temperature sensor that is thermally coupled to the lens 510, and a multi-channel thermopile for detecting occupancy, user approaches, and motion signatures. The Fresnel lens elements of the lens 510 are made from a high-density polyethylene (HDPE) that has an infrared transmission range appropriate for sensitivity to human bodies. The lens 510 may also include thin sections that allow a near-field proximity sensor 552, such as a multi-channel thermopile, and a temperature sensor to "see-through" the lens 510 with minimal interference from the polyethylene. As shown in FIGS. 5A-5B, the front edge of the outer rotatable ring 512, cover 514, and lens 510 are shaped such that they together form an integrated convex rounded front face that has a common outward arc or spherical shape arcing outward.

Although being formed from a single lens-like piece of material such as polycarbonate, the cover 514 has two different regions or portions including an outer portion 514o and a central portion 514i. According to some embodiments, the cover 514 is darkened around the outer portion 514o, but leaves the central portion 514i visibly clear so as to facilitate viewing of an electronic display 516 disposed underneath. According to some embodiments, the cover 514 acts as a lens that tends to magnify the information being displayed in electronic display 516 to users. According to some embodiments the central electronic display 516 is a dot-matrix layout (i.e. individually addressable) such that arbitrary shapes can be generated. According to some embodiments, electronic display 516 is a backlit, color liquid crystal display (LCD). An example of information displayed on the electronic display 516 is illustrated in FIG. 5A, and includes central numerals 520 that are representative of a current setpoint temperature. The thermostat 102 may be constructed such that the electronic display 516 is at a fixed orientation and does not rotate with the outer rotatable ring 512. For some embodiments, the cover 514 and lens 510 also remain at a fixed orientation and do not rotate with the outer ring 512. In alternative embodiments, the cover 514 and/or the lens 510 can rotate with the outer rotatable ring 512. According to one embodiment in which the diameter of the thermostat 102 is about 84 mm, the diameter of the electronic display 516 is about 54 mm. According to some embodiments the curved shape of the front surface of thermostat 102, which is made up of the cover 514, the lens 510 and the front facing portion of the ring 512, is spherical, and matches a sphere having a radius of between 100 mm and 180 mm. According to some embodiments, the radius of the spherical shape of the thermostat front is about 156 mm.

Motion sensing with PIR sensor 550 as well as other techniques can be used in the detection and/or prediction of occupancy. According to some embodiments, occupancy information is used in generating an effective and efficient scheduled program. A second near-field proximity sensor 552 is also provided to detect an approaching user. The near-field proximity sensor 552 can be used to detect proximity in the range of up to 10-15 feet. the PIR sensor 550 and/or the near-field proximity sensor 552 can detect user presence such that the thermostat 102 can initiate "waking up" and/or providing adaptive screen displays that are based on user motion/position when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, the thermostat 102 may be controlled by at least two types of user input, the first being a rotation of the outer rotatable ring 512 as shown in FIG. 5A, and the second being an inward push on head unit 540 until an audible and/or tactile "click" occurs. For such embodiments, the head unit 540 is an assembly that includes the outer ring 512, the cover 514, the electronic display 516, and the lens 510. When pressed inwardly by the user, the head unit 540 travels inwardly by a small amount, such as 0.5 mm, against an interior switch (not shown), and then springably travels back out when the inward pressure is released, providing a tactile "click" along with a corresponding audible clicking sound. Thus, for the embodiment of FIGS. 5A-5B, an inward click can be achieved by direct pressing on the outer rotatable ring 512 itself, or by indirect pressing of the outer rotatable ring 512 by virtue of providing inward pressure on the cover 514, the lens 510, or by various combinations thereof. For other embodiments, the thermostat 102 can be mechanically configured such that only the outer ring 512 travels inwardly for the inward click input, while the cover 514 and lens 510 remain motionless.

FIG. 5B illustrates a right side elevation view of the thermostat 102. According to some embodiments, the thermostat 102 includes a processing system 560, display driver 564 and a wireless communications system 566. The processing system 560 is adapted to cause the display driver 564 and display 516 to display information to the user, and to receive user input via the outer rotatable ring 512. The processing system 560, according to some embodiments, is capable of carrying out the governance of the operation of thermostat 102 including various user interface features. The processing system 560 is further programmed and configured to carry out other operations, such as maintaining and updating a thermodynamic model for the enclosure in which the HVAC system is installed. According to some embodiments, a wireless communications system 566 is used to communicate with devices such as personal computers, other thermostats or HVAC system components, smart phones, local home wireless networks, routers, gateways, home appliances, security systems, hazard detectors, remote thermostat management servers, distributed sensors and/or sensor systems, and other components it the modern smart-home environment. Such communications may include peer-to-peer communications, communications through one or more servers located on a private network, or and/or communications through a cloud-based service.

According to some embodiments, the thermostat 102 includes a head unit 540 and a backplate (or wall dock) 542. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs, and/or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit (s) or from a common wire, if available. According to some embodiments, the rechargeable battery 522 may include a single cell lithium-ion battery, or a lithium-polymer battery.

FIGS. 6A-6D illustrate exploded front and rear perspective views, respectively, of the thermostat 102 with respect to its two main components, which are the head unit 540 and the backplate 542. In the drawings shown herein, the "z" direction is outward from the wall, the "y" direction is the toe-to-head direction relative to a walk-up user, and the "x" direction is the user's left-to-right direction.

Figure 6A:
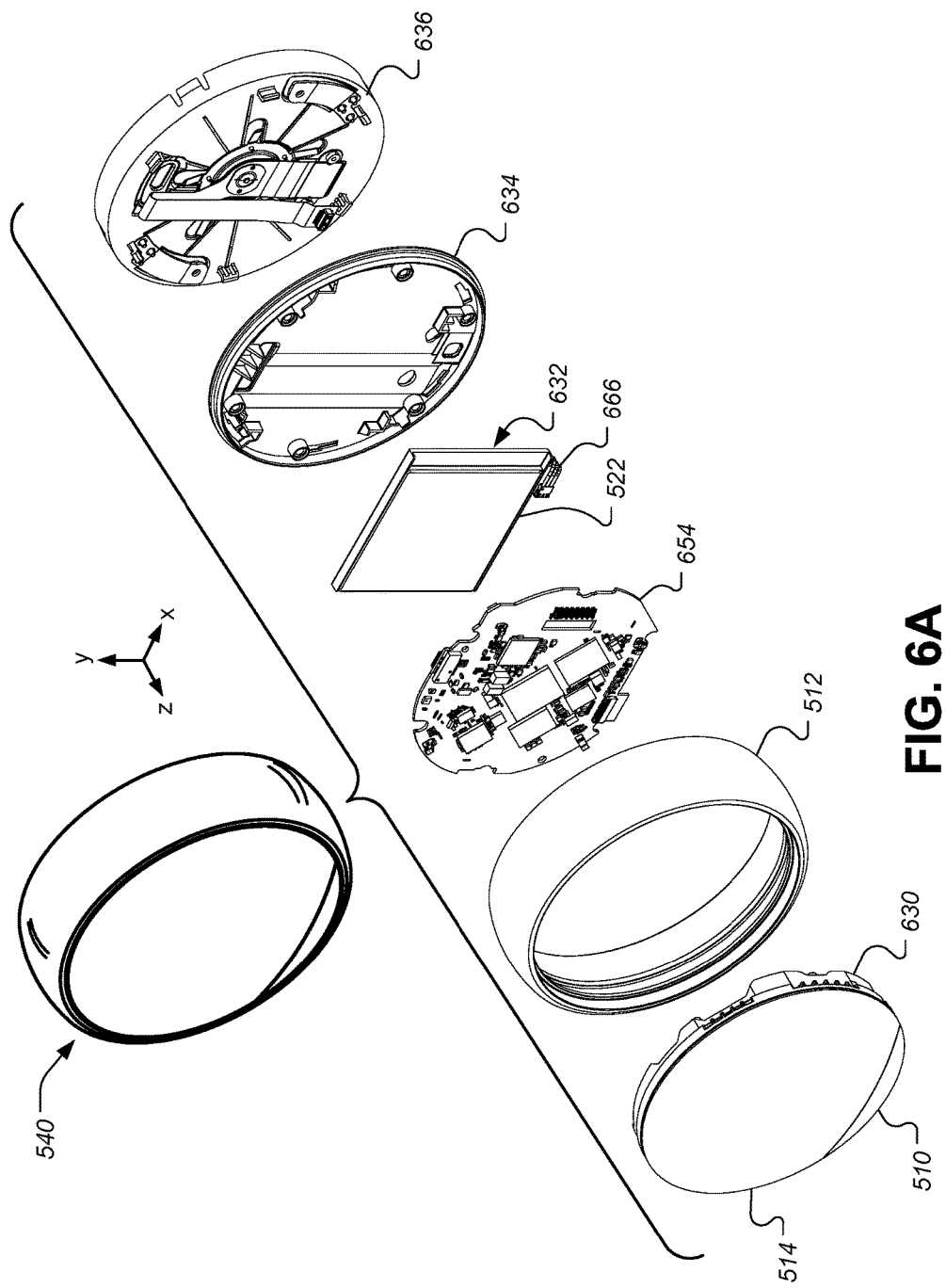
FIG. 6A illustrates an exploded front perspective view of a head unit with respect to its primary components, according to some embodiments.

FIG. 6A illustrates an exploded front perspective view of the head unit 540 with respect to its primary components. Head unit 540 includes, a back cover 636, a bottom frame 634, a battery assembly 632 with the rechargeable battery 522, a head unit printed circuit board (PCB) 654, the outer rotatable ring 512, the cover 514, and the lens 510. Behind the lens is the display assembly 630, which will be described in relation to FIG. 6B below. Electrical components on the head unit PCB 654 can connect to electrical components on the back plate 542 by virtue of a plug-type electrical connector on the back cover 636. The head unit PCB 654 is secured to head unit back cover 636 and display assembly 630. The outer rotatable ring 512 is held between a bearing surface on the display assembly 630 and bearing surfaces on the bottom frame 634. Motion of the outer rotatable ring 512 in the z direction is constrained by flat bearing surfaces on the display assembly 630 and bottom frame 634, while motion of the ring in x and y directions are constrained at least in part by circular rounded surfaces on the bottom frame 634. According to some embodiments, the bearing surfaces of the bottom frame 634 and/or the display assembly 630 are greased and/or otherwise lubricated to both smooth and dampen rotational movement for the outer ring 512. The head unit printed PCB 654 may include some or all of processing system 560, display driver 564, wireless communication system 566, and battery recharging circuitry 524 as shown and described with respect to FIG. 5A, as well as one or more additional memory storage components. According to some embodiments, circuitry and components are mounted on both sides of head unit PCB 654. Although not shown, according to some embodiments, shielding can surround circuitry and components on both sides of the head unit PCB 654.

Battery assembly 632 includes a rechargeable battery 522. Battery assembly 632 also includes connecting wires 666, and a battery mounting film that is attached to battery 522 using a strong adhesive and/or the any rear shielding of head unit PCB 654 using a relatively weaker adhesive. According to some embodiments, the battery assembly 632 is user-replaceable.

Figure 6B:
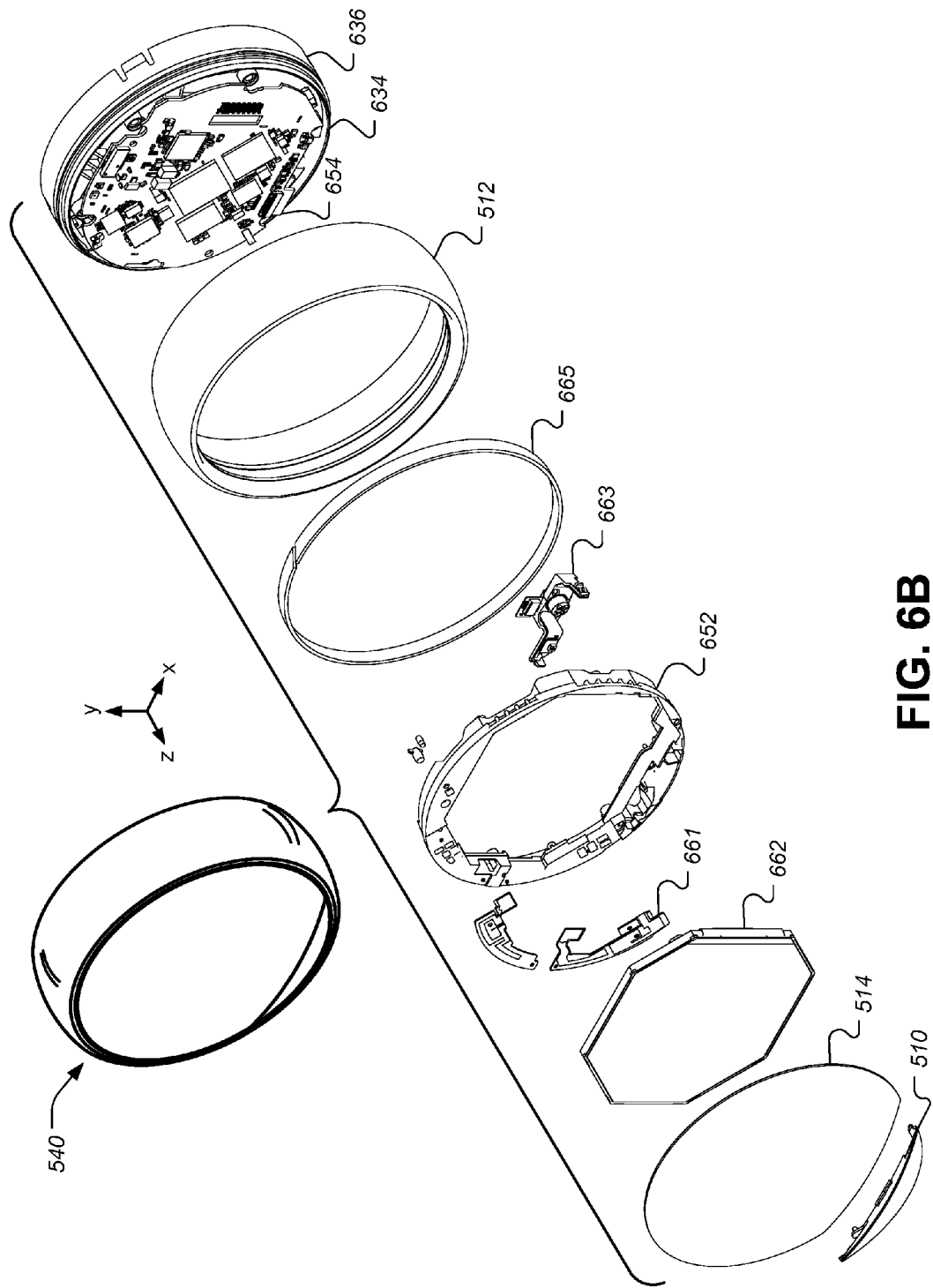
FIG. 6B illustrates an exploded front perspective view of a head unit display assembly with respect to its primary components, according to some embodiments.

FIG. 6B illustrates an exploded front perspective view of the head unit 540 with an exploded view of the display assembly 630. The display assembly 630 comprises the cover 514, the lens 510, an LCD module 662, a pair of RF antennas 661, a head unit top frame 652, a sensor flex assembly 663, and a magnetic ring 665. The sensor flex assembly 663 connects to the head unit PCB 654 using a connector on a flexible PCB. The sensor flex assembly 663 also includes the PIR sensor 550 and the near-field proximity sensor 552. Additionally, the sensor flex assembly 663 may include a temperature sensor IC that is positioned close to the lens 515 so as to accurately measure temperature outside of the thermostat 102 without being overly affected by internal heating of thermostat components. The sensor flex assembly 663 may be comprised of these three sensors, along with a flexible PCB (including the connector for the head unit PCB 654) and a plastic bracket to which the sensors and flexible PCB are mounted. The bracket ensures that the sensor flex assembly 663 is positioned and oriented consistently and correctly with respect to the lens 510. The lens 510 includes two sections that are thinned to approximately 0.3 mm in front of the near-field proximity sensor 552 and the temperature sensor. The lens 510 also includes a section with a Fresnel lens pattern in front of the PIR sensor 550. In some embodiments, additional temperature sensors may be placed throughout the thermostat 102, such as a temperature sensor on the head unit PCB 654 and a temperature sensor on the back plate PCB 680.

The head unit PCB 554 includes a Hall effect sensor that senses rotation of the magnetic ring 665. The magnetic ring 665 is mounted to the inside of the outer rotatable ring 512 using an adhesive such that the outer rotatable ring 512 and the magnetic ring 665 are rotated together. The magnetic ring 665 includes striated sections of alternating magnetic polarity that are diagonally positioned around the magnetic ring 665. The Hall effect sensor senses the alternations between magnetic polarities as the outer ring 512 is rotated. The Hall effect sensor can be controlled by a primary processor, which is a higher powered processor, without excessive power drain implications because the primary processor will invariably be awake already when the user is manually turning the outer rotatable ring 512 to control the user interface. Advantageously, very fast response times can also be provided by the primary processor.

The antennas 661 are mounted to the top surface of the head unit top frame 652. The wireless communications system 566 may include Wi-Fi radios of various frequencies (e.g., 2.4 GHz and 5.0 GHz), along with an IEEE 802.15.4-compliant radio unit for a local-area smart home device network that may include other thermostats, hazard detectors, security system modules, and so forth. The IEEE 802.15.4 unit may use the Thread protocol for achieving such communications. In some embodiments, the wireless communications system 566 may also include a Bluetooth low energy (BLE) radio for communication with user devices.

The processing system 560 may be primarily located on the head unit PCB 654 and may include a primary processor and a secondary processor. The primary processor may be a comparatively high-powered processor, such as the AM3703 chip, or the MCIMX6X3EVK10AB chip from Freescale™, and may be programmed to perform sophisticated thermostat operations, such as time-to-temperature calculations, occupancy determination algorithms, ambient temperature compensation calculations, software updates, wireless transmissions, operation of the display driver 564, and regulation of the recharging circuitry 524. The secondary processor, such as the STM32L chip from ST microelectronics, may be a comparatively low-power processor when compared to the primary processor. The secondary processor may interact with the HVAC system to control a series of FET switches that control the functioning of the HVAC system. The secondary processor may also interface with various sensors in thermostat 102, such as the temperature sensors, a humidity sensor, an ambient light sensor, and/or the like. The secondary processor may also share duties with the primary processor in regulating the recharging circuitry 522 to provide power to all of the electrical systems on board the thermostat 102. Generally, the primary processor will operate in a "sleep" mode until high-power processing operations (e.g., wireless communications, user interface interactions, time-to-temperature calculations, thermal model calculations, etc.) are required, while the secondary processor will operate in an "awake" mode more often than the primary processor in order to monitor environmental sensors and wake the primary processor when needed.

Figures 6C, 6D:
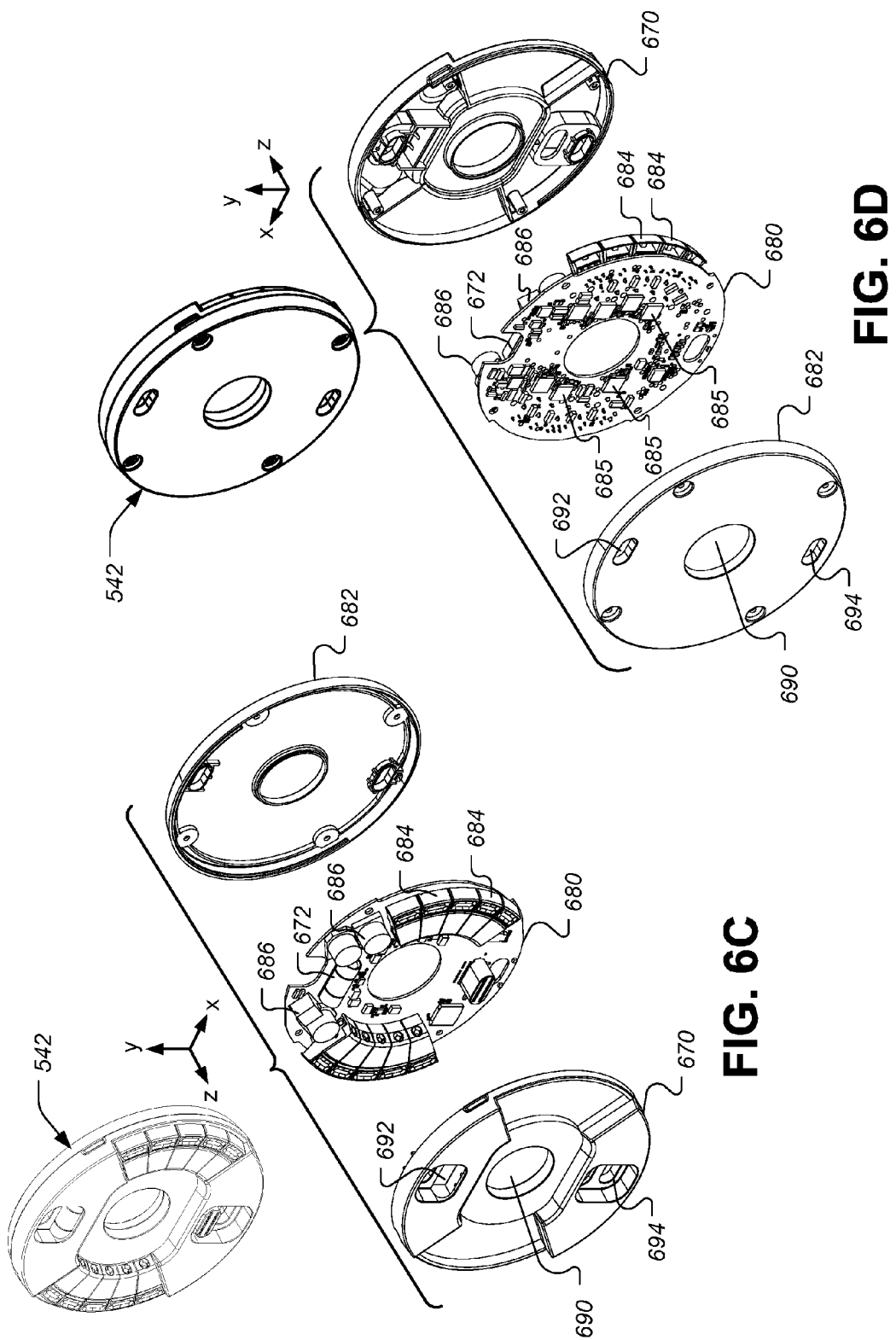
FIGS. 6C-6D illustrate exploded front and rear perspective views, respectively, of a back plate unit with respect to its primary components, according to some embodiments.

FIGS. 6C-6D illustrate exploded front and rear perspective views, respectively, of the back plate unit 542 with respect to its primary components, according to some embodiments. Back plate unit 542 comprises a back plate rear plate 682, a back plate PCB 680, and a back plate cover 670. Visible in FIG. 6C are the HVAC wire connectors 684 that include integrated mechanical wire insertion sensing circuitry, and relatively large capacitors 686 that are used by part of the power stealing circuitry that is mounted on the back plate PCB 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. Also visible in FIGS. 6C-6D are a bubble level 672 to allow the user to install the thermostat 102 in a level position without additional tools.

The back plate PCB 680 also may include approximately seven custom power isolation ICs 685 that isolate the internal electronics of the thermostat 102 from the relatively high 24 VAC signals of the HVAC system. The power isolation ICs 685 are custom software-resettable fuses that both monitor transient and anomalous voltage/current signals on the HVAC power/return wires and switch off the connection to isolate the thermostat against any dangerous signals that could damage the internal electronics. The power isolation ICs 685 receive command signals encoded in a clock square wave from the processing system 560 to open and close a pair of power FETs for each HVAC return wire in order to activate the corresponding HVAC function (e.g., fan, air-conditioning, heat, heat pump, etc.).

Figure 7:
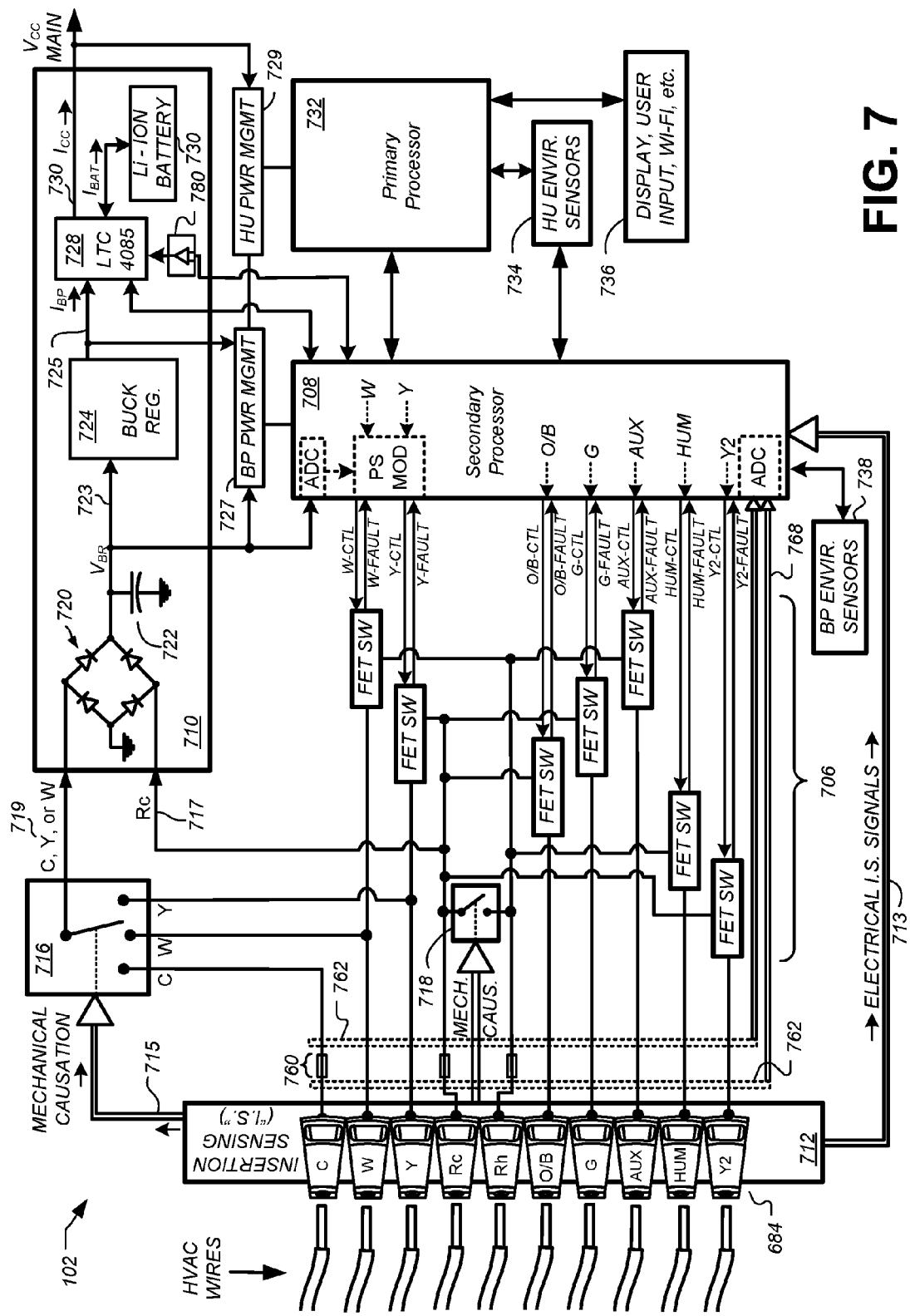
FIG. 7 illustrates a block diagram illustrating circuitry within a thermostat, according to some embodiments.

FIG. 7 illustrates a power management and power harvesting system for a smart thermostat, according to some embodiments. FIG. 7 shows connections to common HVAC wiring, such as a W (heat call relay wire); Y (cooling call relay wire); Y2 (second stage cooling call relay wire); Rh (heat call relay power); Rc (cooling call relay power); G (fan call relay wire); O/B (heat pump call relay wire); AUX (auxiliary call relay wire); HUM (humidifier call relay wire); and C (common wire). As discussed above, the thermostat 102 comprises a plurality of FET switches 706 (such as the power isolation ICs 685 of FIG. 6D above) used for carrying out the essential thermostat operations of connecting or "shorting" one or more selected pairs of HVAC wires together according to the desired HVAC operation. The operation of each of the FET switches 706 is controlled by the secondary processor 708 which can comprise, for example, an STM32L 32-bit ultra-low power ARM-based microprocessor available from ST Microelectronics.

Thermostat 102 further comprises powering circuitry 710 that comprises components contained on both the backplate 542 and head unit 540. Generally speaking, it is the purpose of powering circuitry 710 to extract electrical operating power from the HVAC wires and convert that power into a usable form for the many electrically-driven components of the thermostat 102. Thermostat 102 further comprises insertion sensing components 712 configured to provide automated mechanical and electrical sensing regarding the HVAC wires that are inserted into the thermostat 102. Thermostat 102 further comprises a relatively high-power primary processor 732, such as an AM3703 Sitara ARM microprocessor available from Texas Instruments, that provides the main general governance of the operation of the thermostat 102. Thermostat 102 further comprises environmental sensors 734/738 (e.g., temperature sensors, humidity sensors, active IR motion sensors, passive IR motion sensors, multi-channel thermopiles, ambient visible light sensors, accelerometers, ambient sound sensors, ultrasonic/infrasonic sound sensors, microwave sensors, GPS sensors, etc.), as well as other components 736 (e.g., electronic display devices and circuitry, user interface devices and circuitry, wired communications circuitry, wireless communications circuitry, etc.) that are operatively coupled to the primary processor 732 and/or secondary processor 708 and collectively configured to provide the functionalities described in the instant disclosure.

The insertion sensing components 712 include a plurality of HVAC wiring connectors 684, each containing an internal springable mechanical assembly that, responsive to the mechanical insertion of a physical wire thereinto, will mechanically cause an opening or closing of one or more dedicated electrical switches associated therewith. With respect to the HVAC wiring connectors 684 that are dedicated to the C, W, Y, Rc, and Rh terminals, those dedicated electrical switches are, in turn, networked together in a manner that yields the results that are illustrated in FIG. 7 by the blocks 716 and 718. The output of block 716, which is provided at a node 719, is dictated solely by virtue of the particular combination of C, W, and Y connectors into which wires have been mechanically inserted in accordance with the following rules: if a wire is inserted into the C connector, then the node 719 becomes the C node regardless of whether there are any wires inserted into the Y or W connectors; if no wire is inserted into the C connector and a wire is inserted into the Y connector, then the node 719 becomes the Y node regardless of whether there is a wire inserted into the W connector; and if no wire is inserted into either of the C or Y connectors, then the node 719 becomes the W node. Block 718 is shown as being coupled to the internal sensing components 712 by virtue of double lines termed "mechanical causation," for the purpose of denoting that its operation, which is either to short the Rc and Rh nodes together or not to short the Rc and Rh nodes together. Whether the block 718 will short, or not short, the Rc and Rh nodes together is dictated solely by virtue of the particular combination of Rc and Rh connectors into which wires have been mechanically inserted. Block 718 will keep the Rc and Rh nodes shorted together, unless wires have been inserted into both the Rc and Rh connectors, in which case the block 718 will not short the Rc and Rh nodes together because a two-HVAC-transformer system is present. The insertion sensing circuitry 712 is also configured to provide at least two signals to the secondary processor 708, the first being a simple "open" or "short" signal that corresponds to the mechanical insertion of a wire, and the second being a voltage or other level signal that represents a sensed electrical signal at that terminal. The first and second electrical signals for each of the respective wiring terminals can advantageously be used as a basis for basic "sanity checking" to help detect and avoid erroneous wiring conditions.

Basic operation of each of the FET switches 706 is achieved by virtue of a respective control signal (e.g., W-CTL, Y-CTL) provided by the secondary processor 708 that causes the corresponding FET switch 706 to "connect" or "short" its respective HVAC lead inputs for an ON control signal, and that causes the corresponding FET switch 706 to "disconnect" or "leave open" or "open up" its respective HVAC lead inputs for an "OFF" control signal. By virtue of the above-described operation of block 718, it is automatically the case that for single-transformer systems having only an "R" wire (rather than separate Rc and Rh wires as would be present for two-transformer systems), that "R" wire can be inserted into either of the Rc or Rh terminals, and the Rh-Rc nodes will be automatically shorted to form a single "R" node, as needed for proper operation. In contrast, for dual-transformer systems, the insertion of two separate wires into the respective Rc and Rh terminals will cause the Rh-Rc nodes to remain disconnected to maintain two separate Rc and Rh nodes, as needed for proper operation.

Referring now to the powering circuitry 710 in FIG. 7, provided is a configuration that automatically adapts to the powering situation presented to the thermostat 102 at the time of installation and thereafter. The powering circuitry 710 comprises a full-wave bridge rectifier 720, a storage and waveform-smoothing bridge output capacitor 722 (which can be, for example, on the order of 30 microfarads), a buck regulator circuit system 724, a power-and-battery (PAB) regulation circuit 728, and a rechargeable lithium-ion battery 730. In conjunction with other control circuitry including backplate power management circuitry 727, head unit power management circuitry 729, and the secondary processor 708, the powering circuitry 710 is configured and adapted to have the characteristics and functionality described hereinbelow.

By virtue of the configuration illustrated in FIG. 7, when there is a "C" wire presented upon installation, the powering circuitry 710 operates as a relatively high-powered, rechargeable-battery-assisted AC-to-DC converting power supply. When there is not a "C" wire presented, the powering circuitry 710 operates as a power-stealing, rechargeable-battery-assisted AC-to-DC converting power supply. As illustrated in FIG. 7, the powering circuitry 710 generally serves to provide the voltage Vcc MAIN that is used by the various electrical components of the thermostat 102, and that in one embodiment will usually be about 3.7V-3.95V. The general purpose of powering circuitry 710 is to convert the 24 VAC presented between the input leads 719 and 717 to a steady DC voltage output at the Vcc MAIN node to supply the thermostat electrical power load.

Operation of the powering circuitry 710 for the case in which the "C" wire is present is now described. When the 24 VAC input voltage between nodes 719 and 717 is rectified by the full-wave bridge rectifier 720, a DC voltage at node 723 is present across the bridge output capacitor 722, and this DC voltage is converted by the buck regulator system 724 to a relatively steady voltage, such as 4.4 volts, at node 725, which provides an input current $I_{BP}$ to the power-and-battery (PAB) regulation circuit 728.

The secondary processor 708 controls the operation of the powering circuitry 710 at least by virtue of control leads leading between the secondary processor 708 and the PAB regulation circuit 728, which for one embodiment can include an LTC4085-4 chip available from Linear Technologies Corporation. The LTC4085-4 is a USB power manager and Li-Ion/Polymer battery charger originally designed for portable battery-powered applications. The PAB regulation circuit 728 provides the ability for the secondary processor 708 to specify a maximum value $I_{BP}(max)$ for the input current $I_{BP}$. The PAB regulation circuit 728 is configured to keep the input current at or below $I_{BP}(max)$, while also providing a steady output voltage Vcc, such as 4.0 volts, while also providing an output current Icc that is sufficient to satisfy the thermostat electrical power load, while also tending to the charging of the rechargeable battery 730 as needed when excess power is available, and while also tending to the proper discharging of the rechargeable battery 730 as needed when additional power (beyond what can be provided at the maximum input current $I_{BP}(max)$) is needed to satisfy the thermostat electrical power load.

Operation of the powering circuitry 710 for the case in which the "C" wire is not present is now described. As used herein, "inactive power stealing" refers to the power stealing that is performed during periods in which there is no active call in place based on the lead from which power is being stolen. As used herein, "active power stealing" refers to the power stealing that is performed during periods in which there is an active call in place based on the lead from which power is being stolen.

During inactive power stealing, power is stolen from between, for example, the "Y" wire that appears at node 719 and the Rc lead that appears at node 717. There will be a 24 VAC HVAC transformer voltage present across nodes 719/717 when no cooling call is in place (i.e., when the Y-Rc FET switch is open). For one embodiment, the maximum current $I_{BP}(max)$ is set to a relatively modest value, such as 20 mA, for the case of inactive power stealing. Assuming a voltage of about 4.4 volts at node 725, this corresponds to a maximum output power from the buck regulator system 724 of about 88 mW. This power level of 88 mW has been found to not accidentally trip the HVAC system into an "on" state due to the current following through the call relay coil. During this time period, the PAB regulator 728 operates to discharge the battery 730 during any periods of operation in which the instantaneous thermostat electrical power load rises above 88 mW, and to recharge the battery (if needed) when the instantaneous thermostat electrical power load drops below 88 mW. The thermostat 700 is configured such that the average power consumption is well below 88 mW, and indeed for some embodiments is even below 10 mW on a long-term time average.

Operation of the powering circuitry 710 for "active power stealing" is now described. During an active heating/cooling call, it is necessary for current to be flowing through the HVAC call relay coil sufficient to maintain the HVAC call relay in a "tripped" or ON state at all times during the active heating/cooling call. The secondary processor 708 is configured by virtue of circuitry denoted "PS MOD" to turn, for example, the Y-Rc FET switch OFF for small periods of time during the active cooling call, wherein the periods of time are small enough such that the cooling call relay does not "un-trip" into an OFF state, but wherein the periods of time are long enough to allow inrush of current into the bridge rectifier 720 to keep the bridge output capacitor 722 to a reasonably acceptable operating level. For one embodiment, this is achieved in a closed-loop fashion in which the secondary processor 708 monitors the voltage $V_{BR}$ at node 723 and actuates the signal Y-CTL as necessary to keep the bridge output capacitor 722 charged. According to one embodiment, it has been found advantageous to introduce a delay period, such as 60-90 seconds, following the instantiation of an active heating/cooling cycle before instantiating the active power stealing process. This delay period has been found useful in allowing many real-world HVAC systems to reach a kind of "quiescent" operating state in which they will be much less likely to accidentally un-trip away from the active cooling cycle due to active power stealing operation of the thermostat 102. According to another embodiment, it has been found further advantageous to introduce another delay period, such as 60-90 seconds, following the termination of an active cooling cycle before instantiating the inactive power stealing process. This delay period has likewise been found useful in allowing the various HVAC systems to reach a quiescent state in which accidental tripping back into an active cooling cycle is avoided.

Overcurrent Detection Integrated IC

In addition to the embodiments discussed above, additional embodiments can integrate a solid state switching mechanism, digital controls, and current/voltage limit detection into a single module, such as a single integrated circuit. The single module can provide galvanic isolated blocking of power surges received from the HVAC system and thereby protect the delicate internal circuitry of the intelligent thermostat.

Figure 8:
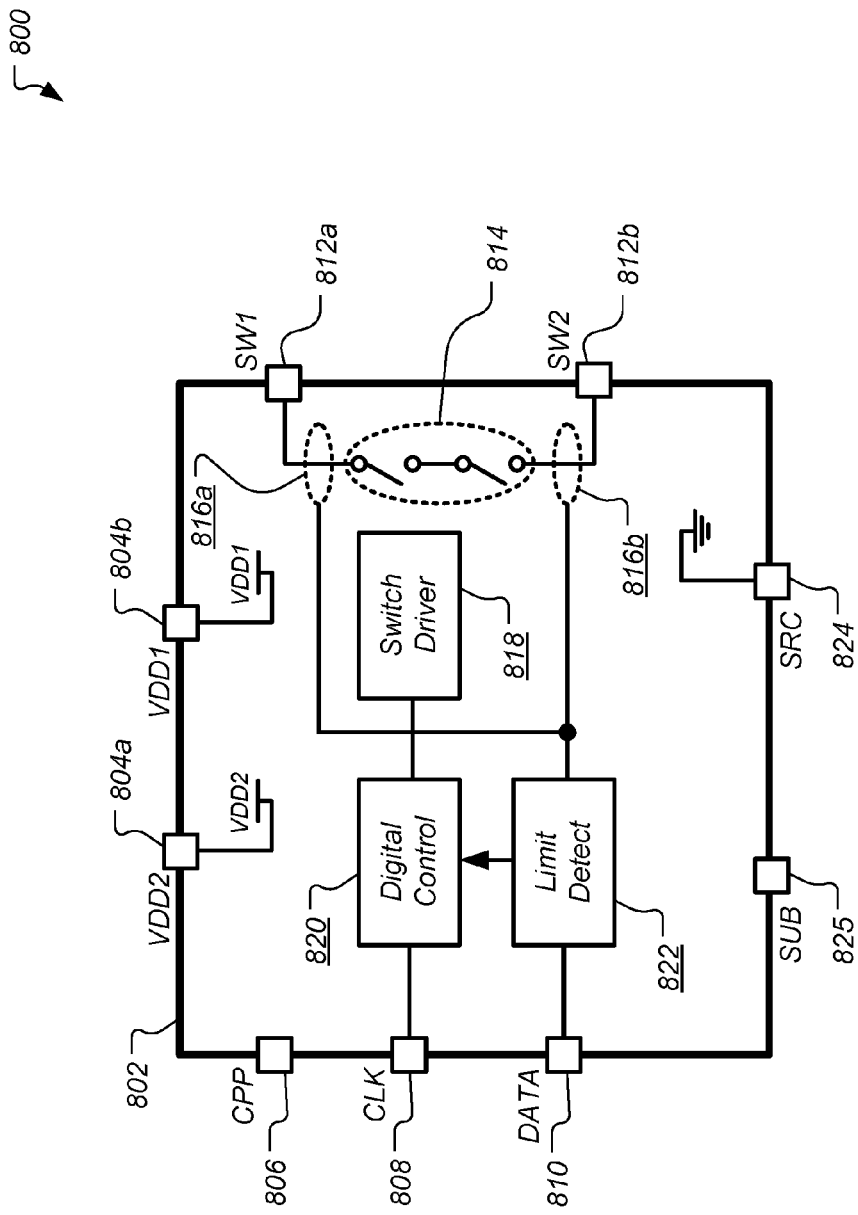
FIG. 8 illustrates a block diagram of an overcurrent detection module, according to some embodiments.

FIG. 8 illustrates a block diagram 800 of an overcurrent detection module 802, according to some embodiments. This simplified block diagram illustrates the primary inputs and outputs of the overcurrent detection module 802, as well as a simplified representation of the internal circuitry used to selectively operate a pair of switches 814. The pair of switches 814 can be coupled to a pair of switch input/output ports 812 configured to receive a 24 VAC signal from the HVAC system. As described above, in order to actuate an HVAC function of the HVAC system, the thermostat can connect a call relay wire to a corresponding power return wire. For example, to turn on an air conditioner, the thermostat can connect a Y call relay wire to an Rc power return wire. The pair of switches 814 can be used to make such a connection.

Occasional noise, power surges, or transient currents may appear on the wires received from the HVAC system at the pair of switch input/output ports 812. Monitoring circuitry 816 can be used to monitor the power conditions associated with the switch 814. A limit detection module 822 can determine when a voltage and/or current measurement associated with the pair of switches 814 exceeds a threshold level for more than a threshold amount of time. In response, the limit detection module 822 can provide an indication to a digital control module 820, which can in turn instruct a switch driver 818 to open the pair of switches 814. By opening the pair of switches 814, the noise, power surges, or transient currents can be interrupted and the internal circuitry of the overcurrent detection module 802, the thermostat, and/or the pair of switches 814 can be protected. Were it not for the limit detection module 822, excessive voltage/currents across the pair of switch input/output ports 812 could damage the pair of switches 814, the switch driver 818, or any other electrical components of the overcurrent detection module 802 and/or the thermostat as a whole. If any of the circuit elements are damaged to the point where the pair of switches 814 can no longer reliably operate, then the thermostat may lose the ability to control the HVAC system, which may be particularly problematic in climates with extreme hot and/or cold temperatures.

In addition to opening the pair of switches 814, the overcurrent detection module 802 can also protect the surrounding thermostat circuitry by isolating the 24 VAC signals from the HVAC system. In some embodiments, the overcurrent detection module 802 can include a clock input 808 that receives a signal from an microprocessor thermostat, such as the head unit microprocessor and/or the backplate microcontroller as described above. The clock input 808 can provide an input to the overcurrent detection module 802 that controls when the pair of switches 814 is opened and/or closed. The clock input 808 can also provide power to the overcurrent detection module 802 such that it can generate its own power rails by which the internal circuitry of the overcurrent detection module 802 can operate. The clock input 808 can be coupled to a charge pump input 806 and used to generate VDD rails 804 by which the digital control module 820, the limit detection module 822, and/or other internal circuitry can operate. Similarly, the overcurrent detection module 802 may include a local ground node 824 (SRC) that is distinct from the ground of the rest of the thermostat. A second ground node 825 (SUB) may also be provided. The second ground node 825 may be tied to a substrate of the IC for the overcurrent detection module 802. In some embodiments, impedance may exist between the first ground node 824 and the second ground node 825. In addition to providing an over current/voltage indication to the digital control module 820, the limit detection module 822 may also provide a data output 810 that can be communicatively coupled to a microprocessor of the thermostat. The data output 810 can be used to provide a signal to the microprocessor indicating that the pair of switches 814 was opened due to a power anomaly condition. Thereafter, the microprocessor can provide signals to the clock input 808 that can reset the overcurrent detection module 802 and/or close the pair of switches 814. A detailed description of the input/output signals provided to/from the overcurrent detection module 802 will be discussed in relation to FIGS. 12-19 below. As used herein, the term "anomaly" may refer to any power, timing, voltage, and/or current abnormality.

Figure 9:
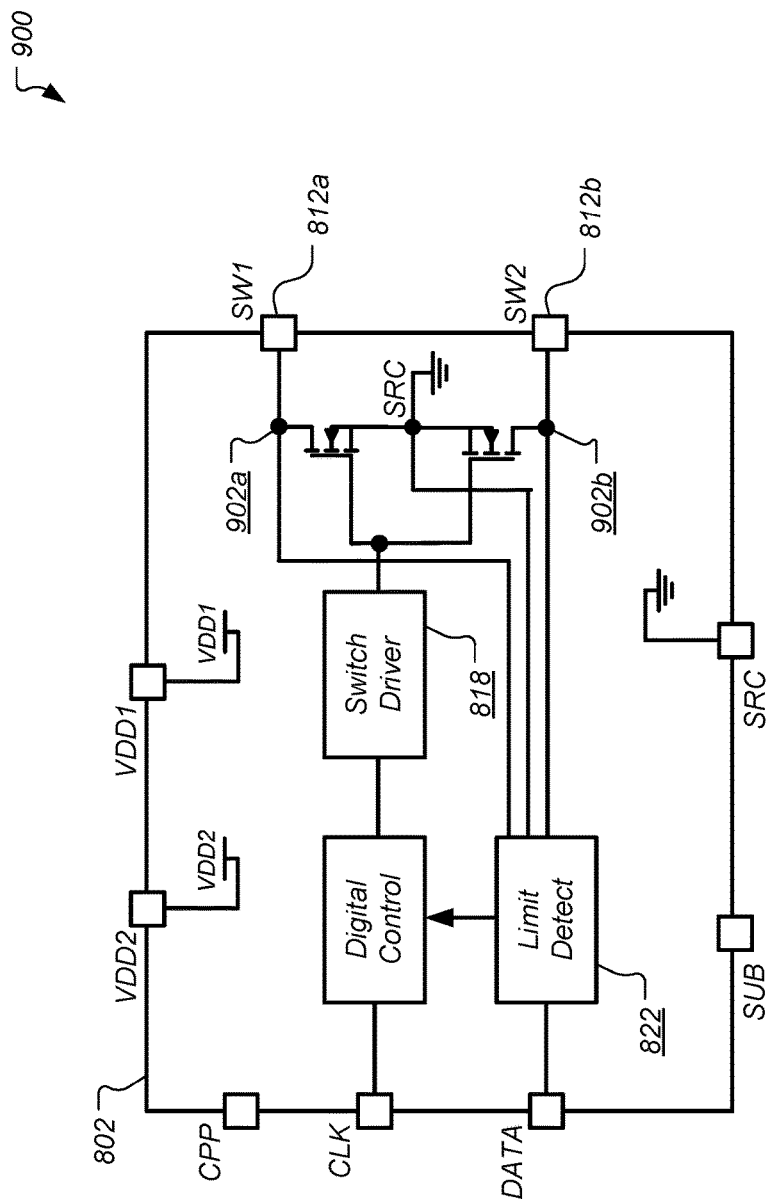
FIG. 9 illustrates a block diagram of an overcurrent detection module with solid-state switching, according to some embodiments.

FIG. 9 illustrates a block diagram 900 of an overcurrent detection module 802 with solid-state switching, according to some embodiments. In order to handle the relatively large currents and voltages received from an HVAC system, traditional thermostats used relays to connect call relay wires to power return wires. As described above, some of the embodiments described herein may include solid-state switching elements in the place of traditional relays. Solid-state switching elements may offer advantages such as the ability to rapidly switch on and off, and to do so relatively silently compared to traditional relays. Solid-state switching elements may be of particular importance in thermostats with power stealing capabilities. For example, during active power stealing when the thermostat is actively calling for an HVAC function by connecting a power return wire to a call relay wire, power stealing circuitry may need to momentarily disconnect the power return wire from the call relay wire in order to generate a voltage difference across these terminals. The power stealing can then use the voltage difference to charge power storage elements, such as capacitors and/or rechargeable batteries. However, the call relay wire should only be disconnected from the power return wire momentarily, such that the current in the transformer of the HVAC system does not dissipate enough to turn off the HVAC function. Therefore, high-speed switching elements, such as solid-state switches may be necessary in power stealing thermostats.

In this particular embodiment, two or more field effect transistors (FETs) 902 may be used as a switching element. In the embodiment of FIG. 9, a pair of FETs 902a, 902b are used. The switch driver 818 can provide an output voltage to bias the gate of each of the FETs 902 in order to control their operation. It will be understood that other numbers and/or types of switching circuit elements may be used in place of the FETs 902 of FIG. 9 without departing from the spirit of this disclosure.

In order to detect a power anomaly across the pair of input/output switches 812, the limit detection module 822 can monitor the drain-to-source voltages of the FETs 902. These voltage measurements can be used to detect abnormally high voltage levels across the pair of input/output switches 812. These voltage measurements can also be used to calculate abnormally high currents running through the FETs 902. For example, the limit detection module 822 can use the measured voltage difference between the drain and source of FET 902a in order to determine when the current running through the FET 902a has reached an excessive level. The precise voltage/current levels detected by the limit detection module 822 may vary with each embodiment and potential application. For example, one thermostat embodiment may trip to limit detection module 822 at currents ranging between approximately 4.0 A and 7.2 A depending on temperature (which in turn may range between −40 C and 125 C) with a typical value of 5.5 A at normal operating temperatures. In one single-FET embodiment, the FET may include an on-resistance of between 75 mΩ and 150 mΩ in a temperature range of between −10 C and 60 5 C, with a typical value of approximately 105 mΩ. The limit detection module 822 may allow for momentary glitches of high current/voltage without tripping. For example, one embodiment may allow high voltage/current glitches lasting less than approximately 25 μs to pass without triggering a response by the limit detection module 822.

Turning back briefly to FIG. 7, the FET switching modules ("FET SW") in 706 used to make connections between call relay wires and power return wires include an additional output, namely the "fault" output. The FET switching modules 706 in FIG. 7 may be implemented using one or more of the overcurrent detection modules described above in relation to FIG. 8 and/or FIG. 9. In a generic sense, the control input and fault output of the FET switching modules 706 may correspond to the clock input and data output of the overcurrent detection module in FIG. 12.

The backplate microcontroller 708 can receive the fault outputs and provide control inputs for each of the FET switching modules 706. In some embodiments, the backplate microcontroller 708 can send an indication to the primary processor 732 when one or more of the FET switching modules 706 experiences a fault. The primary processor 732 can then execute various algorithms to determine when and how a FET switching module 706 experiencing a fault should be handled. For example, the primary processor 732 may attempt to instruct the secondary processor 708 to close the switch and resume monitoring over current/voltage conditions. A discussion of such algorithms will be described in greater detail below in relation to FIG. 16.

Each FET switching module 706 in FIG. 7 can be implemented using an overcurrent detection module 802 of FIG. 8. Specifically, each connection between a call relay wire and power return wire can be associated with its own overcurrent detection module. In some embodiments, the overcurrent detection module 802 can be implemented as a single IC. In the example of FIG. 7, this would correspond to seven individual overcurrent detection module ICs. Turning back briefly to FIG. 6H, the back plate circuit board 680 may include seven distinct ICs 685—one overcurrent detection module 802 for each call relay wire and power return wire. In other embodiments, all of the overcurrent detection modules can be implemented on a single integrated circuit chip, thus replacing the seven separate IC's with a single, larger IC. One advantage of using separate individual overcurrent detecting switching modules is better circuit heating performance and the ability for the thermostat to be operative for the other six IC's in the event one of the IC's fails. One advantage of using a single, larger IC is potentially lower overall device costs, as seven different components are replaced by a single component.

FIG. 7 also illustrates the connection of the powering circuitry that is capable of power stealing from the heating and cooling call relay wires in relation to the FET switching modules 706. The W and/or Y wires are connected directly to block 716 of the powering circuitry. Note that this connection is made between the HVAC wire connectors 684 and the FET switching modules 706.

Figure 10:
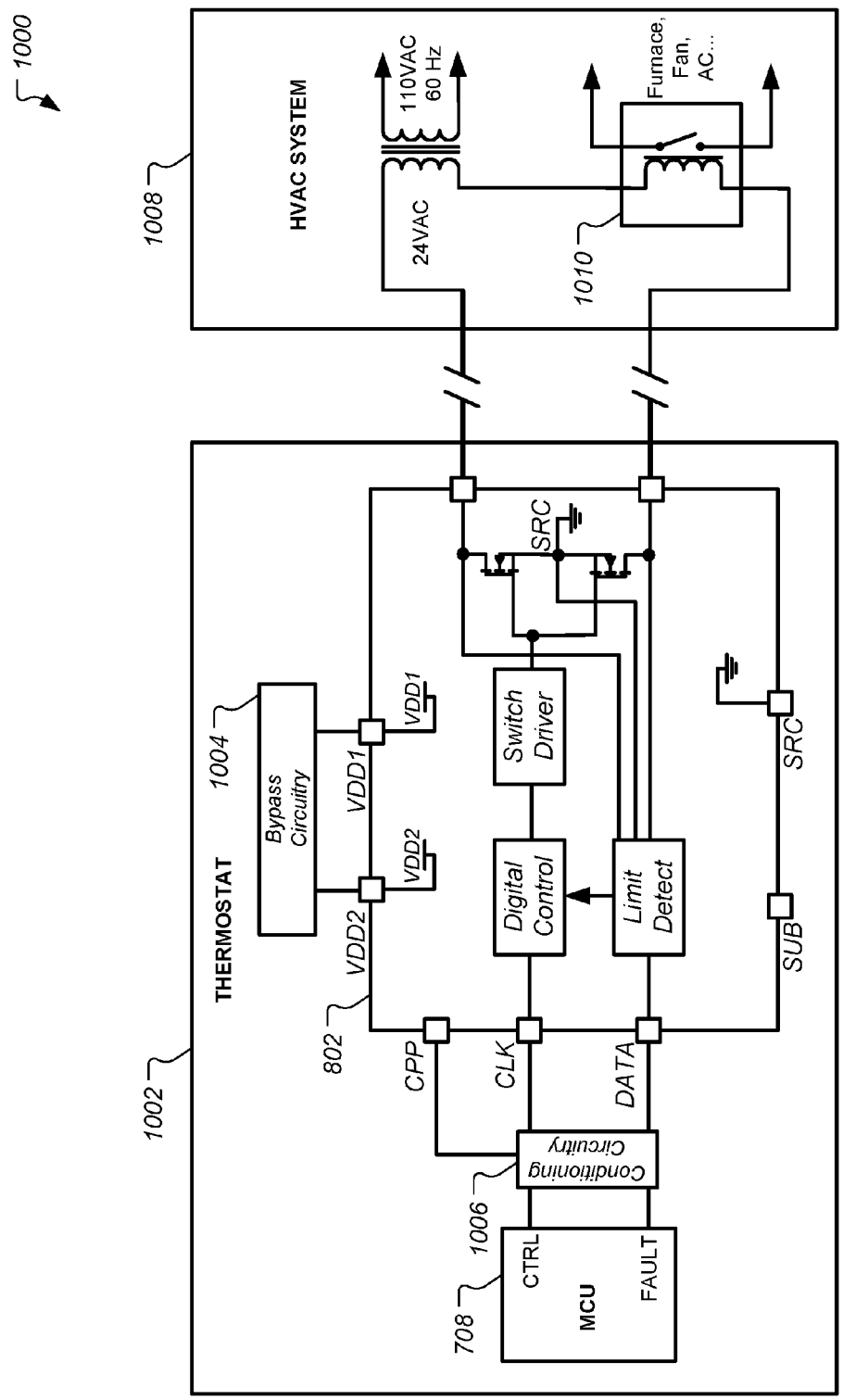
FIG. 10 illustrates a block diagram of a thermostat microprocessor, an overcurrent detection module, and an HVAC system connected in series, according to some embodiments.

FIG. 10 illustrates a block diagram 1000 of a thermostat microprocessor 708, an overcurrent detection module 802, and an HVAC system 1508 connected in series, according to some embodiments. Additional circuitry may be used to interface the overcurrent detection module 802 with the rest of the systems of the thermostat 1002. For example, bypass circuitry 1004 can be used to filter transient AC signals from the internally generated VDD rails of the overcurrent section module 802. In connecting the overcurrent detection module 802 to the backplate microcontroller 708, conditioning circuitry 1006 can be used to condition the control and fault input/outputs communicated between the two ICs. Although not shown explicitly, the thermostat 1002 may also include fuses and/or fuse monitoring circuitry between the overcurrent detection module 802 and the interface to the HVAC system 1008.

Figure 11:
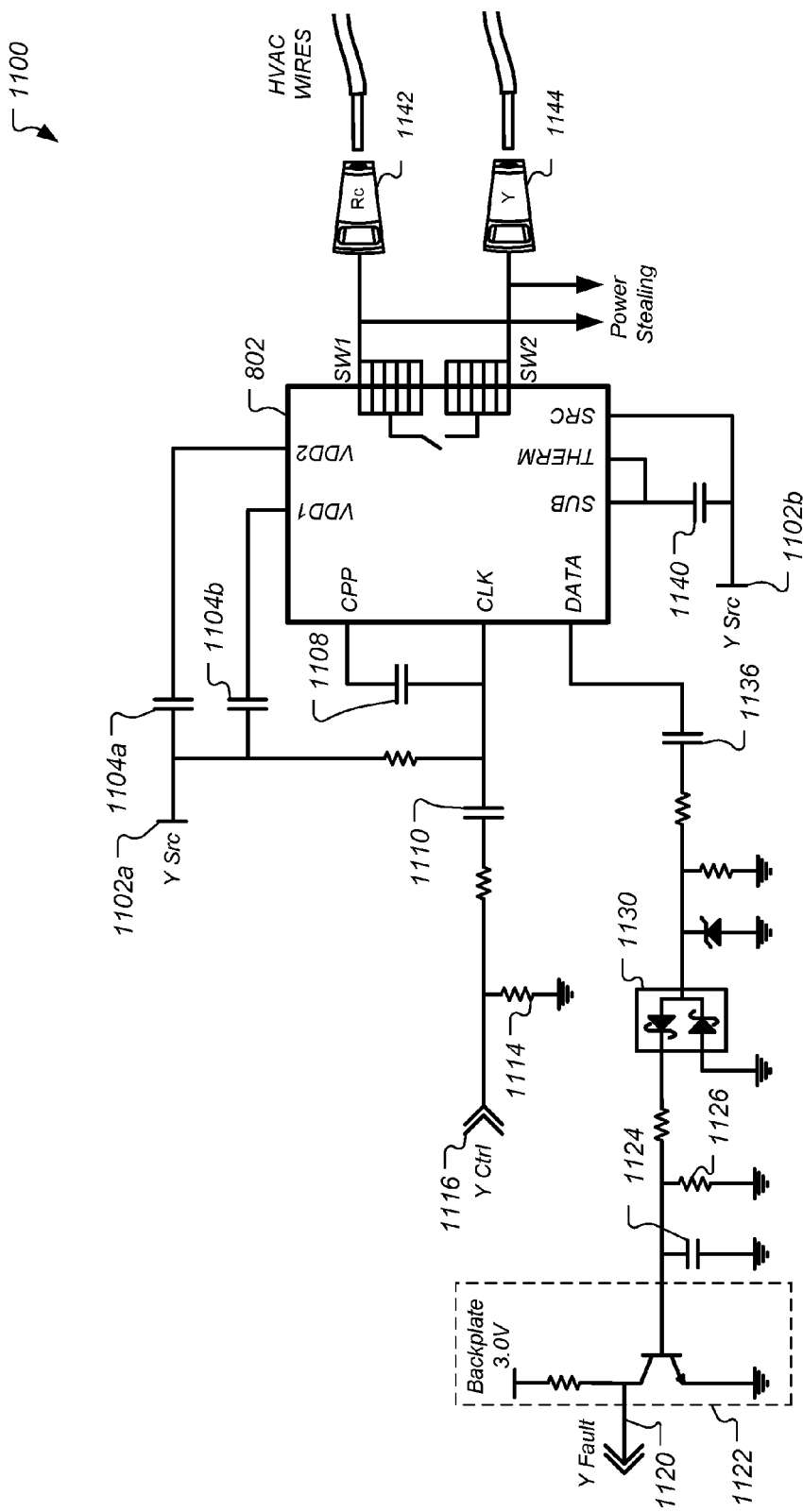
FIG. 11 illustrates a schematic of circuitry to condition inputs and outputs for the overcurrent detection module, according to some embodiments.

FIG. 11 illustrates a schematic 1100 of circuitry to condition inputs and outputs for the overcurrent detection module, according to some embodiments. The circuits of schematic 1100 related to an air-conditioning function, and thus use Y and Rc signals for example purposes only. It will be understood that other HVAC functions, call relay wires, power return wires, and/or backplate microcontroller I/O signals can be substituted without restriction. Additionally, schematic 1100 illustrates a possible implementation of the bypass circuitry 1004 and the conditioning circuitry 1006 in FIG. 10. It will be understood that many different circuit implementations are possible, and thus this example is not meant to be limiting.

In order to provide power to the overcurrent detection module 802, the backplate microcontroller can provide a clock signal through input 1116. In some embodiments, the clock signal may comprise a square wave of between approximately 300 kHz and 2000 kHz. The clock voltage may be between approximately 2.9 V and 5.5 V at around 50 μA. Other embodiments may also employ clock signals that are faster or slower than this range. A pulldown resistor 1114 may be coupled to input 1116 in order to ensure that a logical zero is not seen by the overcurrent detection model 802 when a clock pulses not being provided to input 1116. Pulldown resistor 1114 may have a value approximately of 100 kΩ in some embodiments. In order to provide galvanic isolation, capacitor 1110 can be placed in series between input 1116 and a clock input of the overcurrent detection module 802. For example, approximately 640 pF of capacitance may be sufficient in some embodiments.

Internally, the overcurrent detection model 802 can use the power provided by the clock signal from input 1116 to generate internal power rails. A charge pump input on the overcurrent detection model 802 can be coupled to the clock input by way of capacitor 1108. One embodiment may use approximately 100 pF for capacitor 1108. The VDD1 and VDD2 outputs of the overcurrent detection module 802 can correspond to two of the internally generated voltage rails. These voltage rails can be connected through bypass capacitors 1104 two a floating ground 1102 reference by the overcurrent detection module 802. The floating ground 1102 is established at the SRC pin of the overcurrent detection module 802. SUB and THERM indirectly tie to this floating ground as well. By generating its own voltage rails and ground reference, the overcurrent detection module 202 can be electrically isolated from the rest of the thermostat through the isolation capacitors, 1110, 1136.

As an output, the overcurrent detection module 802 can provide an indication of a fault through the DATA output. In some embodiments, the data output of the overcurrent detection module 802 can generate a ground signal for a logical '0' indicating normal operation, and a square-wave clock pulse for a logical '1' signal indicating a fault. The output clock signal may be a subdivided version of the input clock signal provided through input 1116 from the backplate microcontroller. For example, the clock signal provided by the DATA output of the overcurrent protection module 802 may be derived from the input CLK signal by dividing it by an integer value, such as $F_{clk}/4$.

When the clock begins pulsing on the DATA output, it passes through isolation capacitor 1136 (having a value of, for example, 680 pF) into a rectifier circuit 1130. The rectified signal can then be sent through a low pass filter formed by capacitor 1124 and its associated resistor. At this point, the square wave clock signal will be converted to an approximately 0.7 VDC signal. This DC voltage can then be received by a level translation circuit 1122 that will convert the 0.0-0.7 V signal from the rectifier/low pass filter to a voltage level used by the backplate microcontroller, such as 0.0-3.0 V. The level translation circuit 1122 also inverts the rectified DC signal, such that when the DATA output generates the square wave clock signal, the backplate microcontroller sees a logical '0' (0.0V), and when the DATA output is at ground, the backplate microcontroller sees a logical "1" (3.0V).

Figure 12:
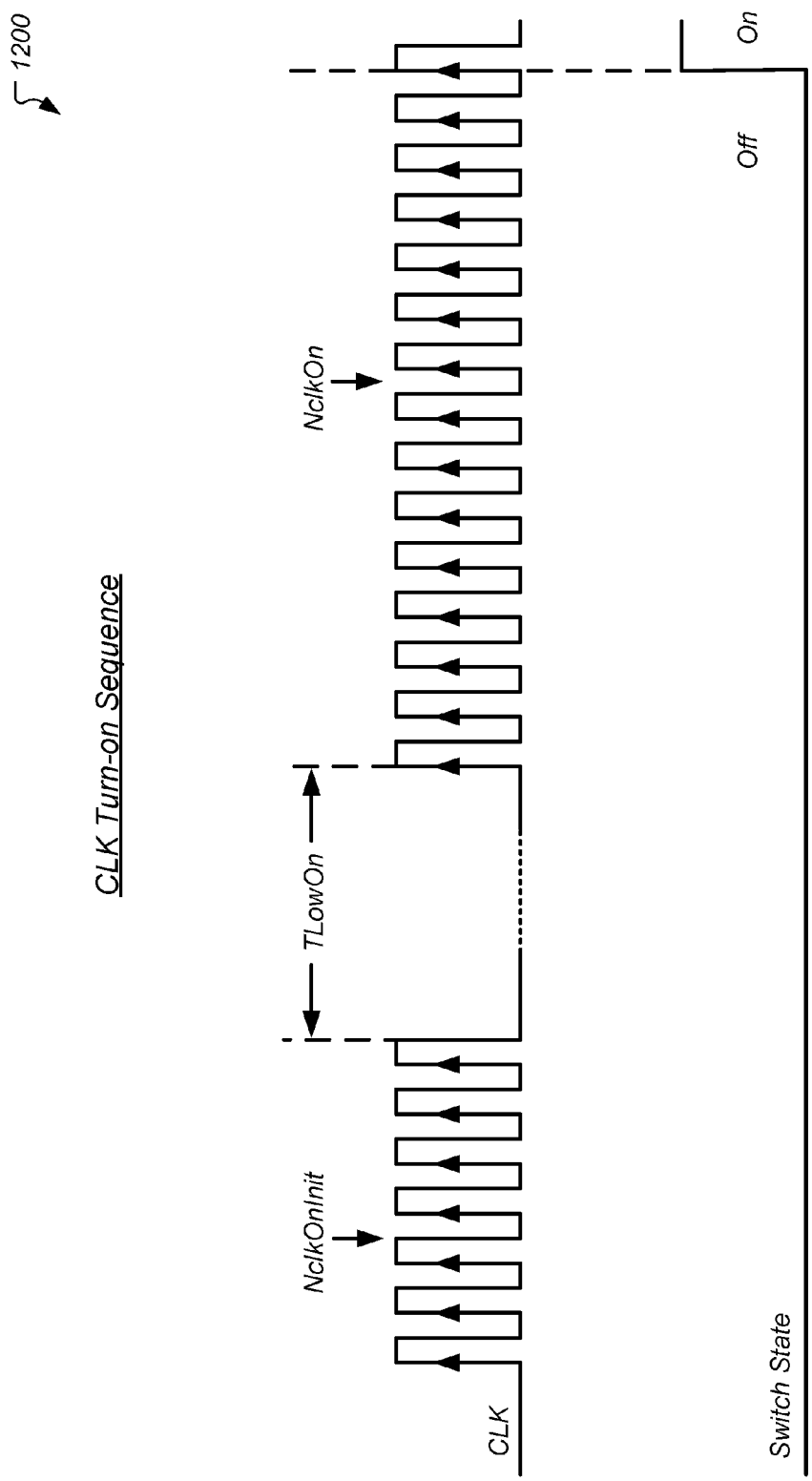
FIG. 12 illustrates a waveform diagram of a turn-on sequence, according to some embodiments.

FIG. 12 illustrates a waveform diagram 1200 of a turn-on sequence, according to some embodiments. FIG. 12, along with FIG. 13 and FIG. 14, describe how the backplate microcontroller and the overcurrent detection module can use the square wave clock pulses described above to communicate with each other. In some embodiments, when the overcurrent detection module begins to see a clock pulse on the CLK input, the charge pump and the internal VDD rails will begin to power up. When the VDD rails reach a threshold level, the overcurrent detection module will initiate a startup routine, and thereby close the switch (e.g., allow current to flow through the FETs by biasing their gate voltages).

However, it is possible for transient AC signals from the HVAC system or from other sources and to be inadvertently coupled onto the CLK input of the overcurrent detection module. If these AC signals are within the frequency range of the expected clock signal, the overcurrent detection module may interpret this noise as a signal from the backplate microcontroller. This could lead the overcurrent detection module to inadvertently boot up and close its switch. The result would be momentarily activating an HVAC function based on a noise input. In order to overcome this problem, some embodiments may use an input clock pattern or sequence that is unlikely to be duplicated by transient AC noise.

Although many different clocking patterns may be used, FIG. 12 illustrates one example pattern that may balance various turn-on requirements. For example, it may be desirable to have a fairly simple pattern that does not require much time compared to the period of the HVAC 24 AC signal. As described above, active power stealing may require the switch within the overcurrent detection module to be rapidly turned on and off compared to the period of the 24 VAC signals from the HVAC system. In this particular example, the backplate microcontroller can generate a certain number of clock pulses that falls in an expected range ("NclkOnInit"). For example, the backplate microcontroller may generate approximately between 3 and 8 pulses. The overcurrent detection module can include a pulse counter that waits for a number of pulses within the expected range to begin the turn-on sequence. After generating the expected number of pulses, the backplate microcontroller may hold the CLK input low for a predefined time interval ("TLowOn"), such as between 10 μs-20 μs. If the overcurrent detection module sees any activity on the CLK line during the predefined time interval, it can end the turn-on sequence. After the time interval expires, the backplate microcontroller can resume sending clock pulses down the CLK line. After a second predefined number of clock pulses ("NclkOn"), the overcurrent detection module can determine that the turn-on sequence has been satisfied and begin its initiation sequence to close the switch. For example, after a 10 μs-20 μs pause, the overcurrent detection module can wait for at least 15 clock pulses before the turn-on sequence is satisfied. Generally, the backplate microcontroller can continuously generate a clock pulse in order to continuously power the overcurrent detection module and keep the switch closed.

Figure 13:
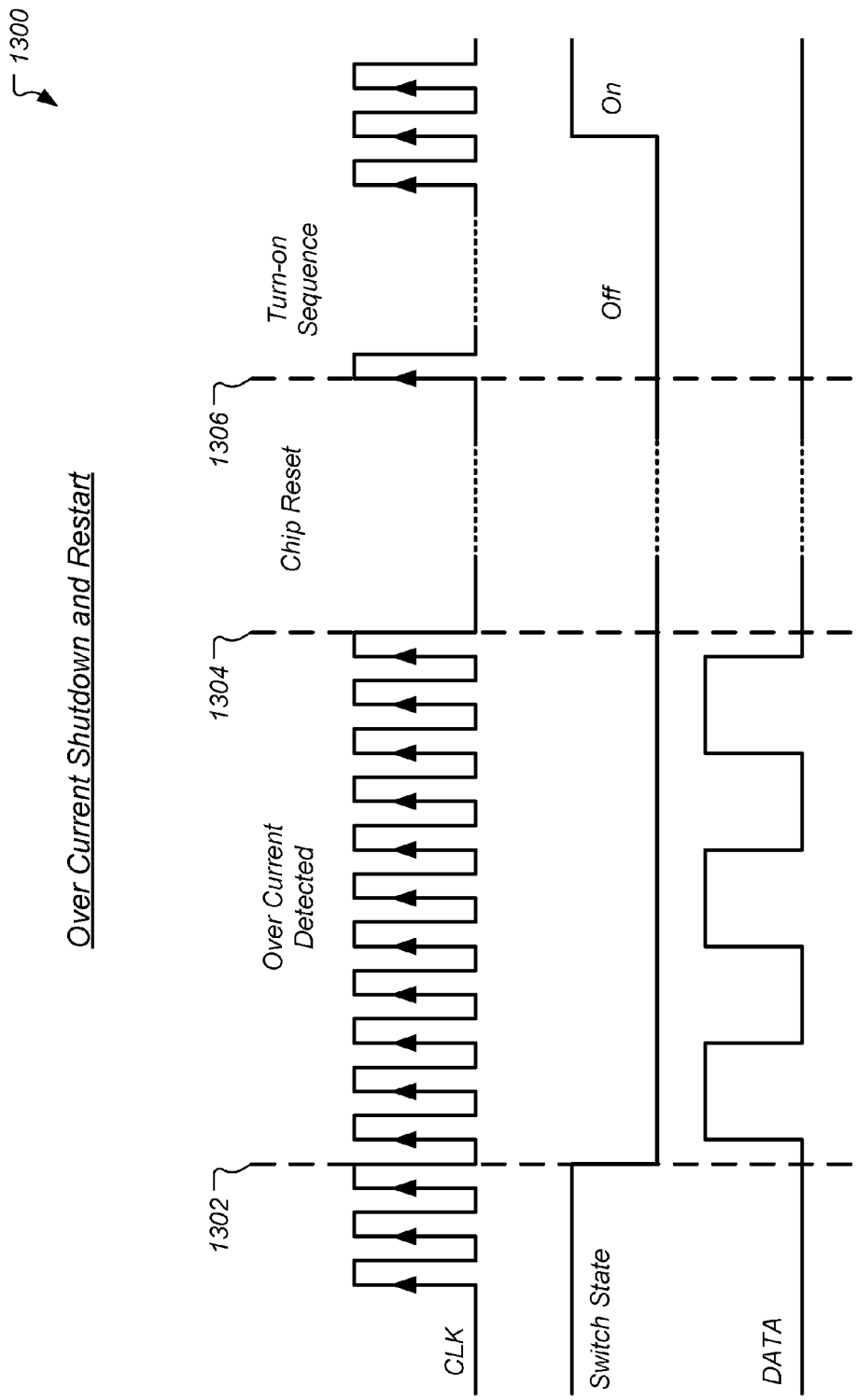
FIG. 13 illustrates a waveform diagram of an over-current shutdown and restart sequence, according to some embodiments.

FIG. 13 illustrates a waveform diagram 1300 of an overcurrent shutdown and restart sequence, according to some embodiments. As described above, during normal operation the backplate microcontroller will continuously generate a square wave clock signal at the CLK input of the overcurrent detection module. At time 1302, the overcurrent detection module may detect a power anomaly, such as a current surge through the switch. In response, the switch driver in the overcurrent detection module can open the switch to the off position to isolate the rest of the thermostat electronics and protect the switch itself from the power anomaly. In response, the overcurrent detection module can begin outputting a square wave clock signal on the DATA output. The DATA output clock signal can simply be a subdivided version of the CLK input clock signal. The backplate microcontroller can receive a digital input based on the DATA output clock signal, and can in turn notify the head unit processor that a power anomaly error has occurred on the corresponding call relay wire.

At this point, the head unit microprocessor has a number of options, which will be discussed in greater detail below. In some cases, the head unit microprocessor may determine that an attempt should be made to resume normal operations by turning the switch back on. In some embodiments, in order to turn the switch back on, the overcurrent detection module must be reset by powering down and restarting. In order to reinitialize the overcurrent detection module, the backplate microcontroller can stop the square wave on the CLK input of the overcurrent detection module. Without the clock signal, the charge pump in the overcurrent detection module will gradually fail and the VDD rails will fall below a threshold level causing the overcurrent detection module to power down. Note that when the input CLK signal stops, the output DATA signal also stops because it is being derived from the input signal. In order to restart the overcurrent detection module, the backplate microcontroller can wait for a turnoff interval to expire, such as between 60 μs and 120 μs, then the backplate microcontroller can go through the turn-on sequence described in relation to FIG. 12 above beginning at time 1306.

Once a power anomaly is detected, some embodiments may immediately turn off the switch. However, this can lead to a lot of stress on the internal components of the overcurrent detection module if the current being received from the HVAC system is at or near its peak. In order to minimize the stress on the electronic components, the overcurrent detection module can wait briefly for the AC current from the HVAC system to near a zero crossing point to shut off the switch. For example, the overcurrent detection module can wait until the instantaneous current through the switch is between ±275 mA. It should also be noted that during power stealing cycles, the power stealing capacitor 722 from FIG. 14 may be able to absorb any excess current, therefore the overcurrent detection module may only need to wait for a zero crossing when power stealing is not currently taking place.

Figure 14:
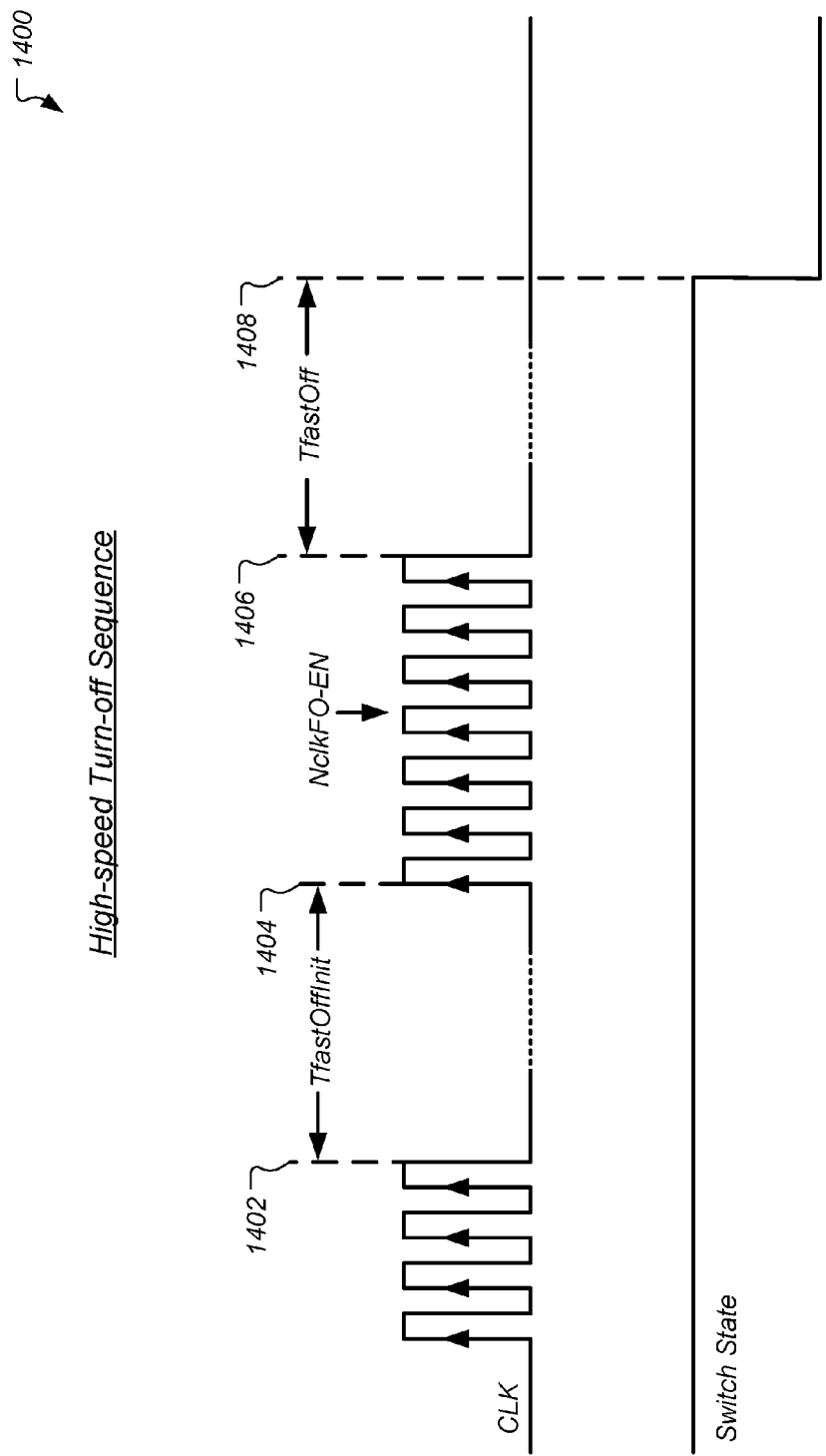
FIG. 14 illustrates a waveform diagram of a high-speed turn-off sequence, according to some embodiments.

FIG. 14 illustrates a waveform diagram 1400 of a high-speed turn-off sequence, according to some embodiments. As described above, during active power stealing, the switch may need to be opened and closed fairly quickly in order to steal power without interrupting the normal functioning of the HVAC operation. Therefore, the overcurrent detection module may also provide a high-speed turn-off sequence. At time 1402, the backplate microcontroller can stop providing the square wave signal to the CLK input for a predefined time interval ("TfastOffInit"), such as between 10 μs and 20 μs. After this predefined time interval has expired, the backplate microcontroller can send a predefined number of clock pulses to the CLK input ("NclkFO-EN"), such as between 6 and 13 pulses. After seeing this sequence, the overcurrent detection module can turn off the switch within approximately 4 μs to 10 μs ("TfastOff"). Depending on the speed requirements, the overcurrent detection module may or may not need to wait for a zero crossing of the current of the HVAC system input.

Figure 15:
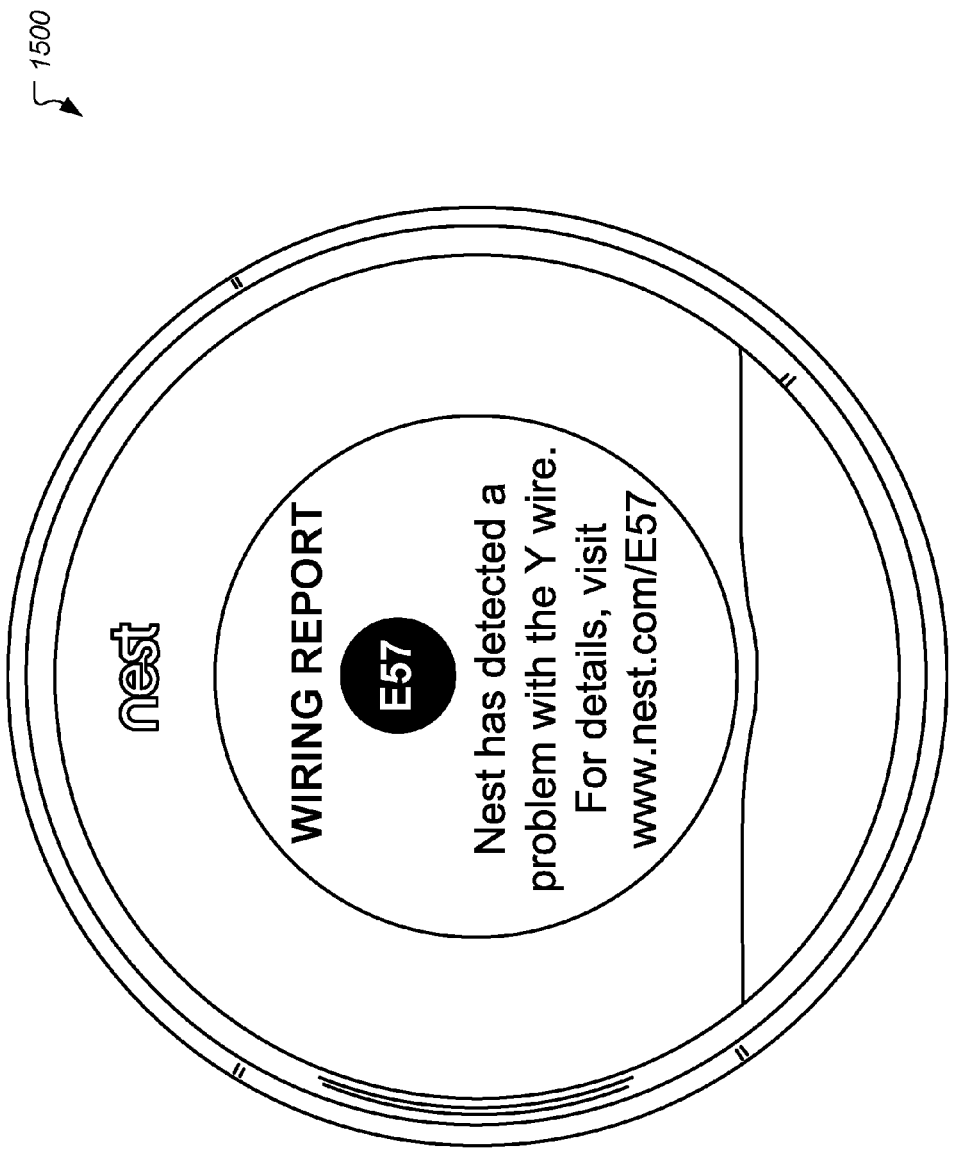
FIG. 15 illustrates a diagram of a user interface for providing an error message using an intelligent control device, according to some embodiments.

FIG. 15 illustrates a diagram 1500 of a user interface for providing an error message using an intelligent control device, according to some embodiments. As will be described below, the head unit processor can attempt one or more times to turn the switch back on. If it is unable to do so, the head unit microprocessor may instead provide an indication to a user or a manufacturer that a persistent error has occurred. Because each call relay wire is associated with a single overcurrent detection module IC and corresponding input pair at the backplate microcontroller, the thermostat can give specific guidance as to which wires are associated with the anomaly. In this example, the thermostat can provide a message that it "has detected a problem with the Y wire." The thermostat also provide a link to a website where additional troubleshooting guidance can be provided to a user. Alternatively or additionally, if the thermostat is network connected, an indication may automatically be sent to a thermostat monitoring server. In response, a manufacturer can contact a user, automatically schedule a service appointment, order replacement parts, and/or the like.

Figure 16:
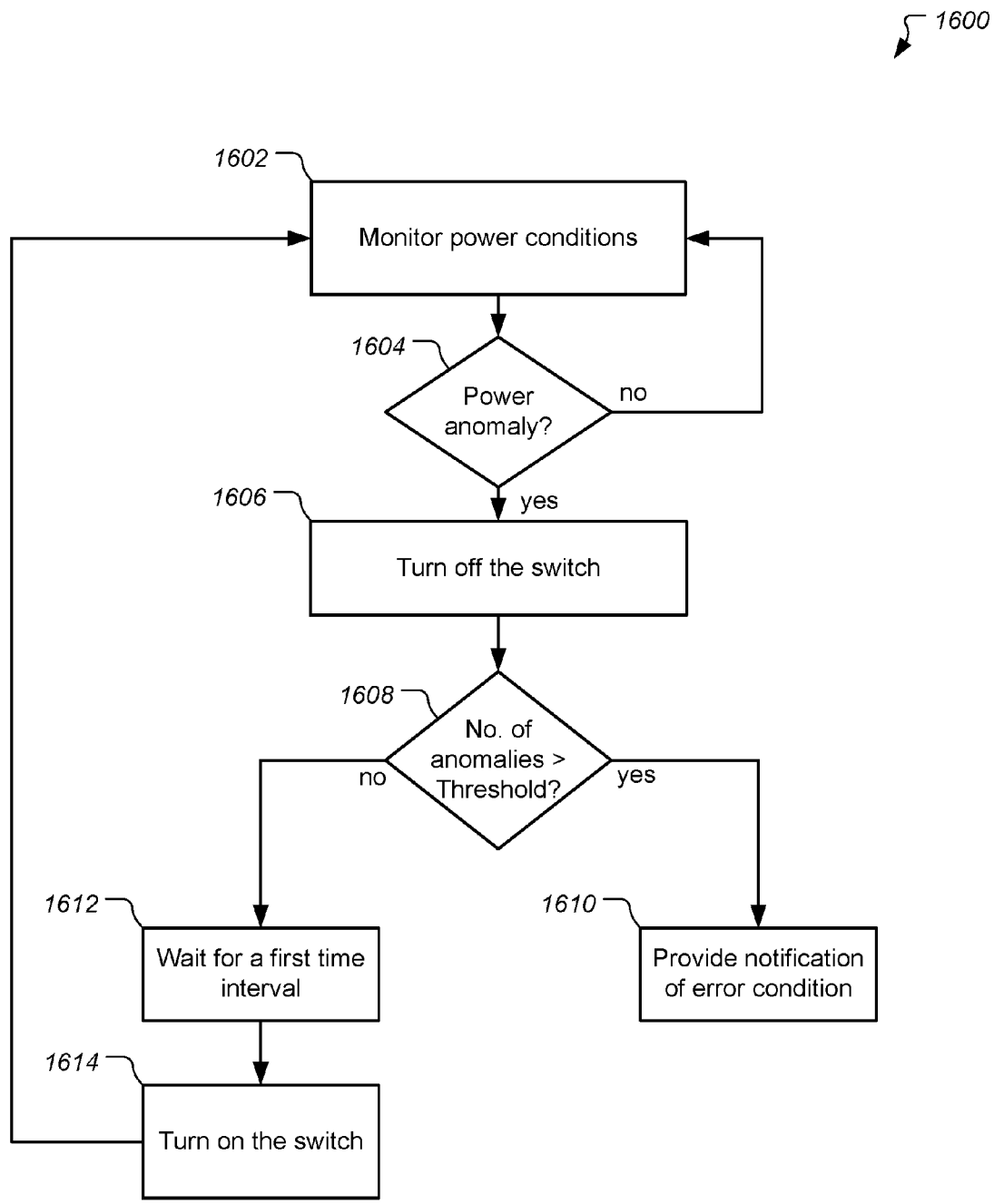
FIG. 16 illustrates a flowchart of a method for handling a power anomaly, according to some embodiments.

FIG. 16 illustrates a flowchart 1600 of a method for handling a power anomaly, according to some embodiments. This algorithm may be executed by the head unit processor in conjunction with the backplate processor in providing commands for the overcurrent detection module. The method may include monitoring power conditions on a switch that activates an HVAC function (1602). For example, the overcurrent detection module can include limit detection for a switch that connects a call relay wire to a power return wire. If a power anomaly is detected (1604), the overcurrent detection module can turn off the switch that activates the HVAC function (1606). The overcurrent detection module can then provide information to a thermostat processor indicating that a fault has occurred.

The thermostat processor (e.g., the head unit microprocessor, the backplate microcontroller) can count the number of detected anomalies encountered. If the number of detected anomalies exceeds a threshold number, then the thermostat processor can provide a notification of an error condition (1610). If the number of detected anomalies has not yet reached that threshold amount, then the microprocessor can wait for a first time interval (1612) during which the power anomaly may subside, and during which time the overcurrent detection module can prepare to turn the switch back on. After the first time interval, the thermostat microprocessor can direct the overcurrent detection module to turn the switch back on (1614). This process can be repeated until the threshold number of power anomalies detected is reached. At this point it may be assumed that the power anomaly is more than just a transient surge or noise coupling and indicates that a more serious problem may need to be investigated. In one embodiment, the time interval between checking for the power anomaly is 16 ms.

In a further embodiment, the method of FIG. 16 can be carried out repeatedly on a larger scale. For example, a fault may be detected on the Y wire 10 times. At this point, the thermostat can turn off the switch and provide an error notification. The thermostat can then wait for a second time interval, such as 1 or 2 minutes and then execute the algorithm in FIG. 16 again. In subsequent passes through the algorithm of FIG. 16, the first time interval may be shortened, and/or the anomaly threshold may be reduced.

Although the concepts of automated sensing of anomalous wiring conditions have been thus far described with respect to a thermostat, according to some embodiments these concepts are applicable beyond the immediate environment of HVAC to the smart home as a whole, as well as to network-based ecosystems and/or more generalized algorithmic paradigms within which the invention may be applicable. The concepts of automated sensing of an anomalous wiring condition combined with automated reporting of the detected condition, by means of an on-device user interface and/or communication over a data network can be applied in several contexts. These advantages can be even further enhanced when there is an automated limiting of the effects of the anomalous condition, and yet still further enhanced when there is a subsequent automated re-sensing or re-testing for the anomalous condition.

According to some embodiments, network-connected, microprocessor controlled irrigation controllers, in which an overcurrent condition on a control wire may be indicative of a stuck irrigation valve. The report goes to a cloud-based servicing system and recommendations, servicing hints, advertisements for superior irrigation valves, and/or automated ordering of replacement valves are then initiated. The cloud-based system can furthermore track the anomaly for that user, and can furthermore can track similar such anomalies across a population of users to detect patterns in the detected overcurrent conditions.

According to some other embodiments, network-connected, microprocessor controlled garage door openers, include sensing for an overcurrent condition on an input power wire may be indicative of an obstruction condition. Similar tracking and pattern detection can be achieved as described above for irrigation controllers. The current-limited switches are generally larger and more powerful than those described with respect to thermostats, since generally line voltages are used. The scope of the described embodiments can therefore extend to any network-connected, microprocessor controlled appliance, and in general to any network-connected, microprocessor controlled device that receives one or more control or power wires, many of which are shown and described with respect to FIG. 1 herein.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

Overcurrent Protection During AC Current Cycles

As described in detail above, smart-home thermostats may rely on switching elements to enable operation and control of the HVAC system and to protect against destructive power anomalies. Modern switching elements have evolved from traditional relays to advanced solid-state circuit designs. Specifically, isolated power switches, silicon circuit breakers, solid state circuit breakers, and/or solid state relays—referred to collectively as SSRs—are designed to replace conventional relays in power-switching circuits. SSRs can be designed for different voltage ratings and different current ratings. Depending on their thermal resistance and ambient temperature characteristics, they can also be designed for different thermal environments. Perhaps most importantly, SSRs support very high switching frequencies.

However, SSRs need to be protected against at least three major failure modes. These failure modes include over voltage anomalies, over current anomalies, and/or over temperature anomalies. Any of those conditions, if not quickly remedied, may damage an SSR. Over-voltage power surges may occur in applications where the local power is fluctuating in voltage due to starting and stopping of nearby drive circuits, inductive loads, noisy mechanical or mercury contactors, machine stop conditions without proper filters, and so forth. These situations can create a variety of voltage surges on the normally unfiltered power lines that directly feed into a switching SSR. Over-current anomalies occur due to in-rush currents at turn on as a consequence of an over voltage surge in the on state, or may result from an improperly designed fuse. Over-temperature anomalies occur due to poor thermal dissipation or connectivity and/or as a consequence of over voltage and over current at the same time for relatively long time intervals.

Prior to this disclosure, a number of different approaches have been used to protect SSRs. In some cases, a triple-layer approach was implemented to protect against these failure conditions which attempted to attenuate, block, and control the anomaly. Attenuation of a surge pulse reduced the over voltage level, and was typically done using a "snubber network." Blocking an over voltage anomaly was typically considered as a technology parameter, defined by a Safe Operating Area (SOA) of the device that defined the voltage the device was able to handle in the "off" state. Controlling the anomaly added a path through the SSR circuit that protected the SSR silicon die from the destructive "punch through" effect that may occur during a momentary voltage surge. However, each of these methods could not safely protect an SSR in an AC application where inductive loads were driven. Specifically, any over-current/over-voltage activation or deactivation of the SSR can drive the SSR beyond its SOA limits causing it to break down permanently.

To solve these and other problems, the embodiments described herein provide a method to safely turn off an SSR in an AC supplied environment with inductive loads upon a detected overload situation. The anomaly may be detected, but the turn off may be done at a point in time when a safe turn-off can be guaranteed. In the on-state of the SSR, the detection of the overload situation may be based on over current detection. The over current detection threshold may be a design parameter of the SSR. Once an over-current anomaly is detected, the SSR may dynamically adopt its $R_{on}$ resistance to prevent a further increase of the current through the SSR. This may keep the current close to or at the over current detection threshold until the AC supply voltage drops to a low enough value to reduce the current through the SSR below the overcurrent detection threshold. The SSR control circuitry can store an indication that an overcurrent situation was detected until the current through the SSR device or the voltage across the SSR device is detected to cross zero. At this point in time the SSR can be turned off automatically and kept in the off state until it can be safely reactivated. Some embodiments would only store the indication that an overcurrent anomaly had occurred, and then keep the SSRs in the on-state until the current through the SSR devices or the voltage across the SSR devices is detected to cross zero, before turning off the SSR.

The SSRs used in the switching circuits described above for a thermostat controlling an HVAC system may be susceptible to each of these types of anomalies unless special precautions are taken. Therefore, the circuit solutions for safely turning off an SSR are described below in the context of a smart-home thermostat connected to an HVAC system. However, these examples are merely examples and not meant to be limiting. Any application where inductive loads are being switched in an AC environment may benefit from these embodiments. For example, any kind of boost converter circuit and/or buck converter circuit where zero crossing switching is desired could benefit from these embodiments. The power train of electric vehicles and/or hybrid electric vehicles, motor driver circuits, and/or smart home device power systems are also examples of circuits that may benefit from these embodiments.

Figure 17:
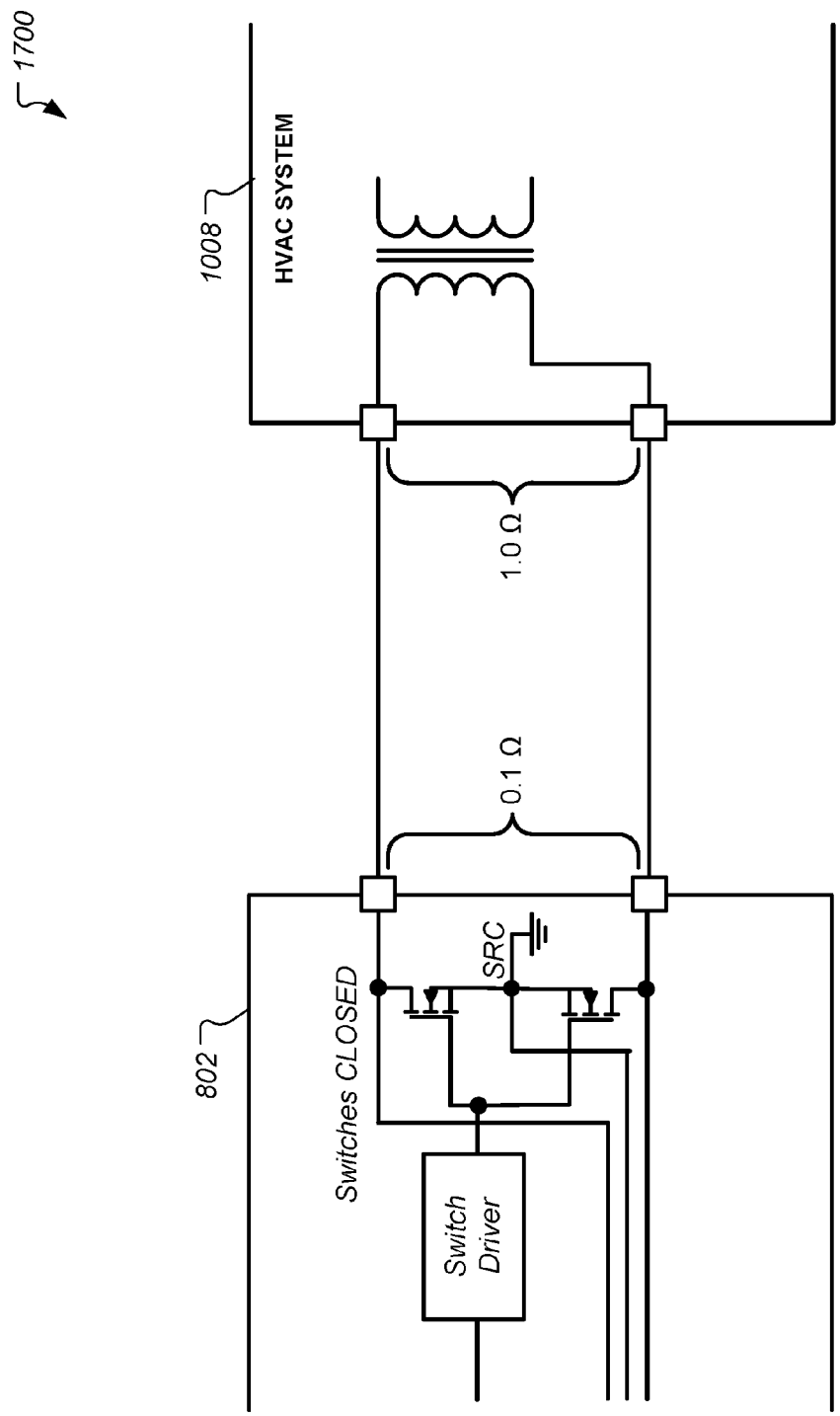
FIG. 17 illustrates a circuit diagram of an overcurrent detection module in a smart-home thermostat that is connected to an HVAC system, according to some embodiments.

FIG. 17 illustrates a circuit diagram of an overcurrent detection module 802 in a smart-home thermostat that is connected to an HVAC system 1008, according to some embodiments. In this embodiment, the switches of the overcurrent detection module 802, represented by a pair of MOSFET circuits, are in a closed state to conduct an AC signal from the HVAC system 1008 through the overcurrent detection module 102. When the switches are closed, the thermostat will effectively activate an HVAC function associated with the power/return wires coupled to the overcurrent detection module 802. For example, the switches of the overcurrent detection module 802 would be closed to connect a "Y" wire emanating from the HVAC system 1008 to a "$R_C$" wire returning to the HVAC system 108.

The HVAC system includes a transformer that senses the 24 VAC signal returned through the return (e.g., "$R_C$") wire in order to activate the associated HVAC function. While the switches of the overcurrent detection module 802 are closed, the on-resistance of the overcurrent detection module 802 is significantly less than the resistance of the transformer of the HVAC system 108. For example, some embodiments of the overcurrent detection module 802 may have an on-resistance of 0.1Ω, while the equivalent resistance of the terminals of the HVAC system 108 would be approximately 1.0Ω. In this example, any power dissipated in the circuit will be primarily dissipated by the HVAC system 1008 rather than by the overcurrent detection module 802 by a factor of approximately 10. Therefore, during a current/voltage anomaly, excessive power will be primarily dissipated by the HVAC system 1008 rather than by the overcurrent detection module 802 as long as the switches of the overcurrent detection module 802 remain closed.

Figure 18:
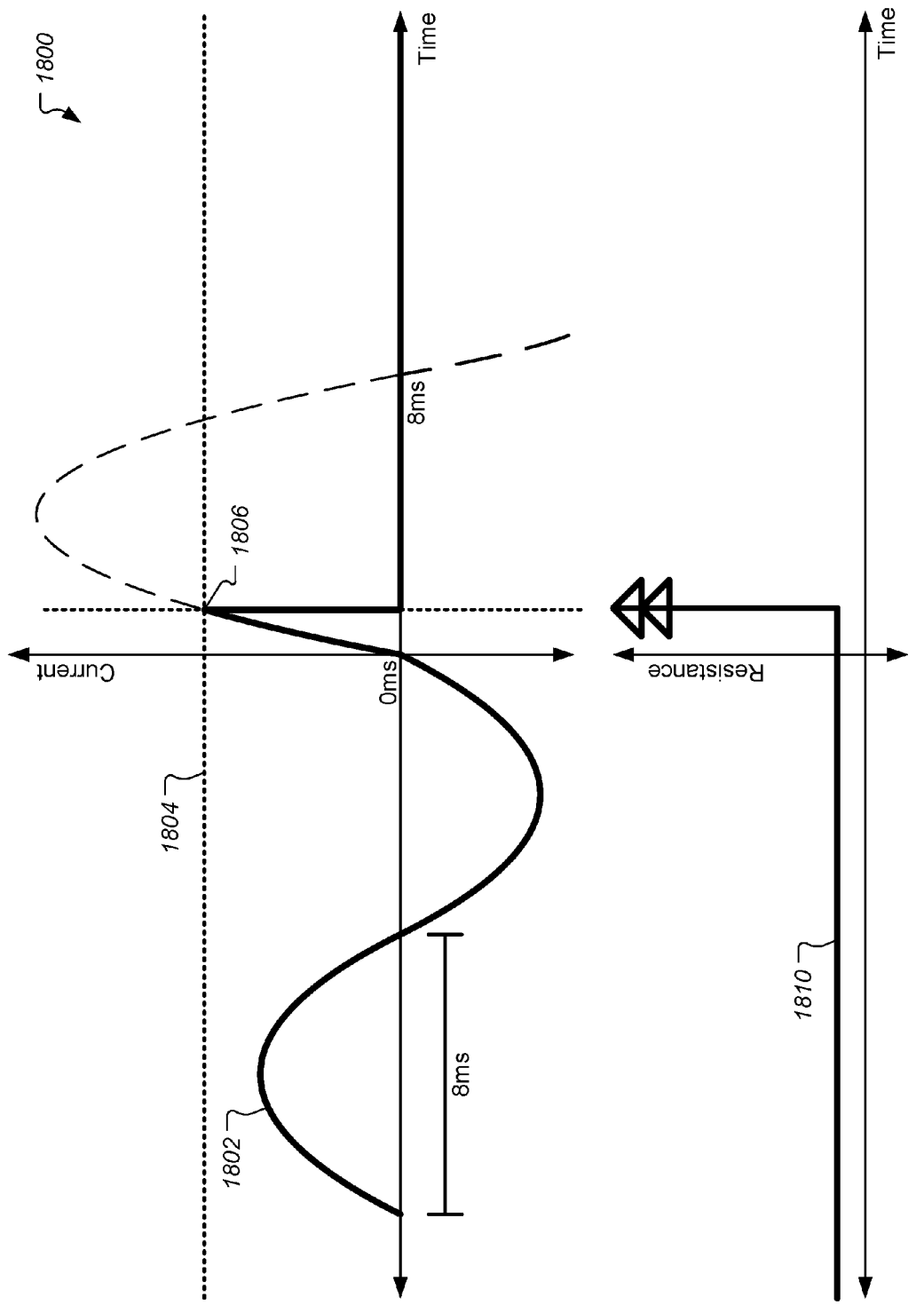
FIG. 18 illustrates ideal current and resistance graphs when an overcurrent anomaly is detected, according to some embodiments.

FIG. 18 illustrates ideal current and resistance graphs when an overcurrent anomaly is detected, according to some embodiments. Curve 1802 represents a typical AC current passing through the SSRs of an overcurrent detection module of the smart-home thermostat. At time t=0 ms, a power anomaly begins resulting in an overcurrent condition on curve 1802. An overcurrent threshold 1804 can be designed or programmed into the overcurrent detection module as described above. When the current represented by curve 1802 surpasses the overcurrent threshold 1804, the SSRs in the overcurrent detection module can be switched off at time 1806. When the SSRs are switched off, curve 1802 ideally drops near to 0 A and remains there until the SSRs are again switched on.

Curve 1810 on the lower axes of FIG. 18 represents the resistance seen by the terminals of the overcurrent detection module. Before time 1806, the $R_{on}$ resistance of the overcurrent detection module is relatively low (e.g., 0.1Ω). However, at time 1806 when the SSRs of the overcurrent detection module are switched off, the $R_{on}$ resistance of the overcurrent detection module dramatically increases, which would ideally cause the current passing through the overcurrent detection module to drop near to 0 A while the SSRs are off. Assuming the ideal operation of FIG. 18, power anomalies can be effectively prevented from damaging the internal circuitry of the overcurrent detection module simply by opening the SSRs.

Figure 19:
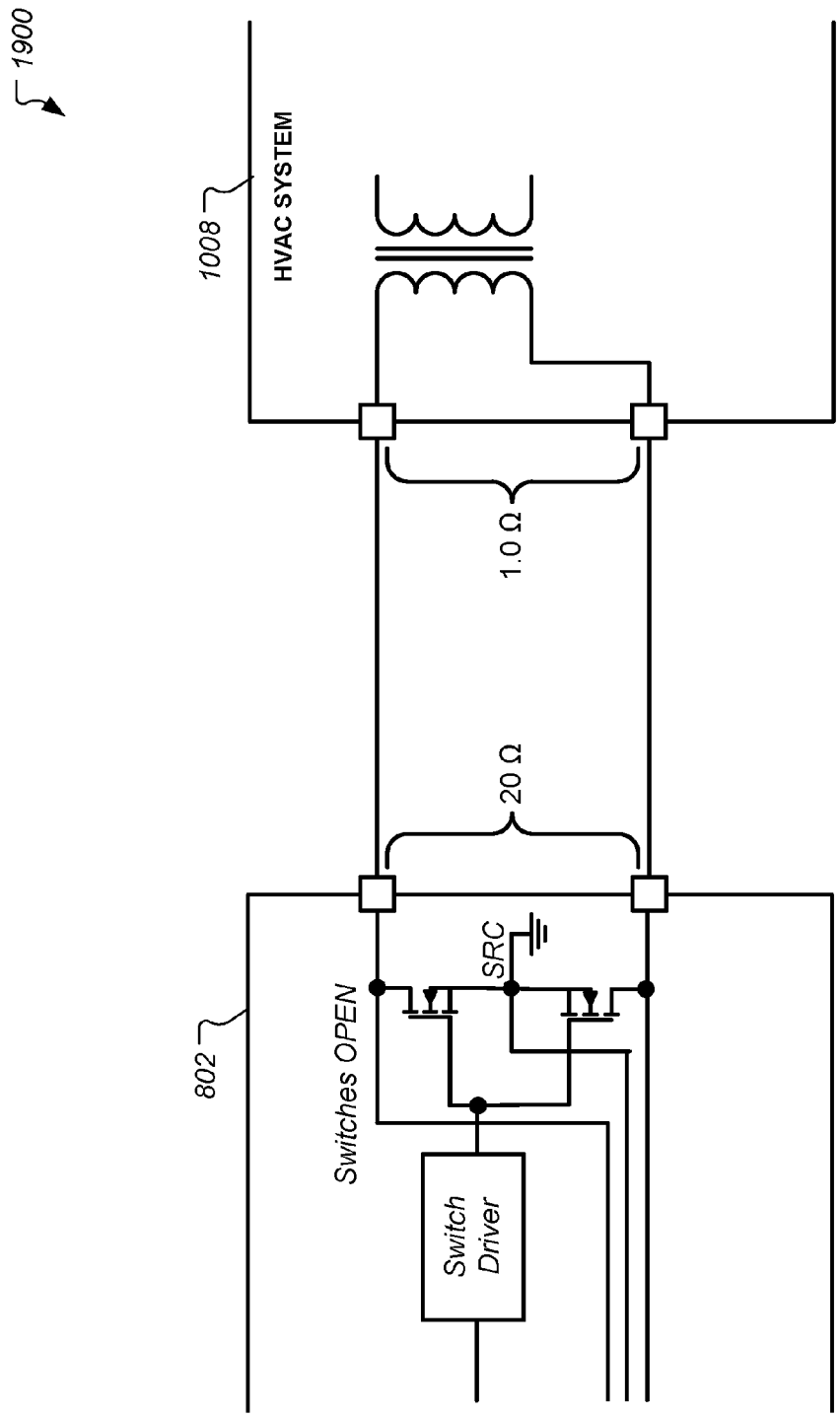
FIG. 19 illustrates the relative resistances of the overcurrent detection module and the HVAC system when the SSRs of the overcurrent detection module are switched off.

However, the ideal conditions depicted in FIG. 18 are not always present in certain silicon circuit layouts. FIG. 19 illustrates the relative resistances of the overcurrent detection module 802 and the HVAC system 1008 when the SSRs of the overcurrent detection module 1802 are switched off. In this example, an overcurrent anomaly may have been detected by the overcurrent detection module 802, causing the switches of the SSRs to be opened. When the SSRs are opened the equivalent resistance seen at the terminals of the overcurrent detection module 802 increases significantly. For example, compared to an equivalent resistance of 0.1Ω when the SSRs are closed, the overcurrent detection module 802 may produce an equivalent resistance of approximately 20Ω when the SSRs are open.

The practical effect during an overcurrent anomaly of the increase in the equivalent resistance of the SSRs in the open state is to cause a large voltage to build up across the SSR terminals. Because the HVAC system 1008 includes an inductive load, the energy built up in the inductive load has to be dissipated somewhere when the SSRs are opened. From a resistive perspective, the overcurrent detection module 802 now has 20 times the resistance of the HVAC system 1008. Therefore, most of the energy in the inductive load of the HVAC system 1008 will be dissipated in the silicon of the overcurrent detection module 802 and its associated SSRs.

The voltage generated by the inductive load when the SSRs are turned off can briefly turn the SSRs back on after the overcurrent anomaly has been detected. Additionally, parasitic circuit elements in the silicon of the SSRs can create conductive paths through the silicon, and the resulting current conduction may have permanent destructive effects on the SSR circuits and/or control circuits.

Figure 20:
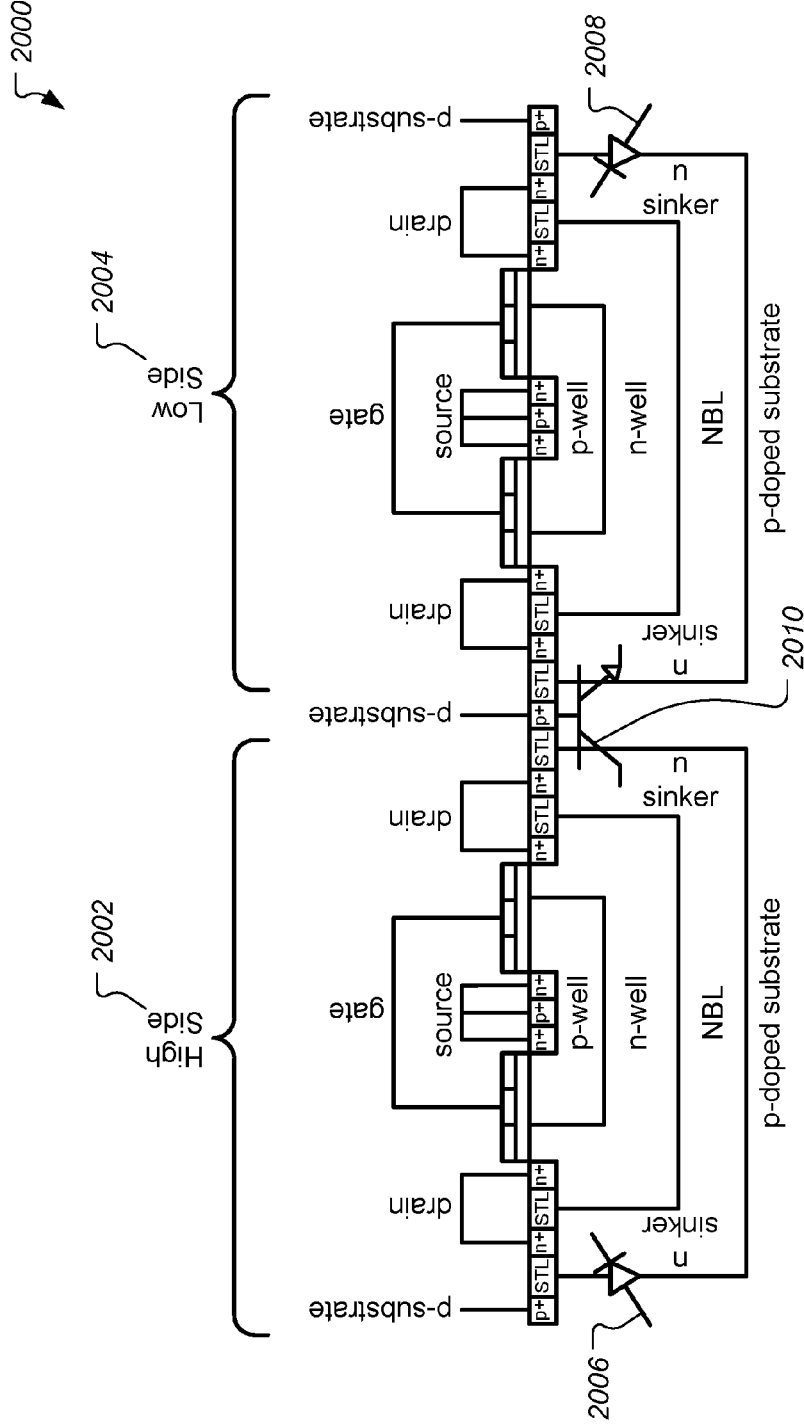
FIG. 20 illustrates a silicon cross section of a dual-MOSFET SSR circuit, according to some embodiments.

FIG. 20 illustrates a silicon cross section of a dual-MOSFET SSR circuit, according to some embodiments. As used herein, the high-side transistor 2002 will refer to the transistor in the MOSFET pair that receives incoming electrical current during a current AC cycle. Similarly, the low-side transistor 2004 will refer to the transistor in the MOSFET pair through which electrical current flows out during the current AC cycle. Note that during positive and negative AC cycles, the low-side transistor 2002 and the high-side transistor 2004 will switch as the direction of the AC current switches. During a current AC cycle, a parasitic diode 2006 forms between the p-doped substrate and the "n sinker" NBL of the drain of the high-side transistor 2002. (The "n sinker" region has a light doping profile, whereas the n-well has a heavier doping profile.) Similarly, a parasitic diode 2008 forms between the P-doped substrate and the drain of the low-side transistor 2004. An NPN bipolar junction transistor 2010 also forms between the P-substrate and the drains of the high-side transistor 2002 and the low-side transistor 2004. Note that there may be different parasitic circuit elements than those depicted explicitly in FIG. 20 based on the specific silicon layout of the transistors.

When an overcurrent anomaly is detected, the high-side transistor 2002 and the low-side transistor 2004 may be switched off simultaneously. This switching may generate the very high voltage across the terminals of the SSRs as described above. Consequently, this high-voltage may cause the parasitic diode 2006 to be forward biased. Current may flow through the forward biased parasitic diode 2006 and through the NPN bipolar junction transistor 2010 and damage the silicon layers of the circuit.

Figure 21:
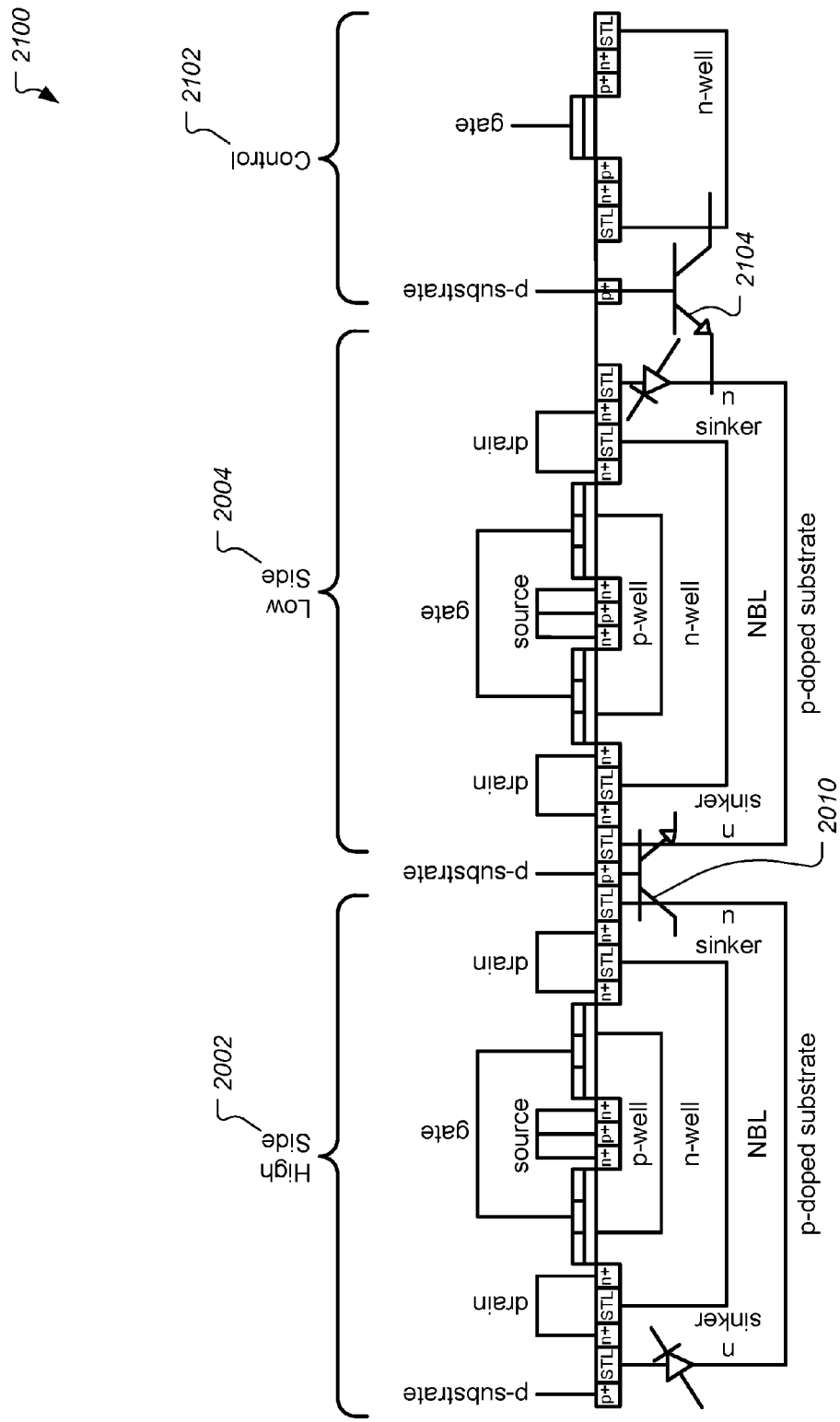
FIG. 21 illustrates a silicon cross-section of a dual-MOSFET SSR circuit with a control circuit, according to some embodiments.

This effect may be compounded when considering the control circuits of the SSRs. FIG. 21 illustrates a silicon cross-section of a dual-MOSFET SSR circuit with a control circuit, according to some embodiments. When the control circuit 2102 is added to the same silicon die, an additional NPN bipolar transistor 2104 is formed between the drain of the low-side transistor 2004, the P-doped substrate, and the gate of the control circuit 2102. When the control circuit 2102 causes the high-side transistor 2002 and the low-side transistor 2004 to turn off in response to an overcurrent anomaly detection, the excessive voltage generated across the high-side transistor 2002 and the low-side transistor 2004 may also cause current to flow through the NPN bipolar transistor 2104 and further cause damage to the control circuit 2102.

Figure 22:
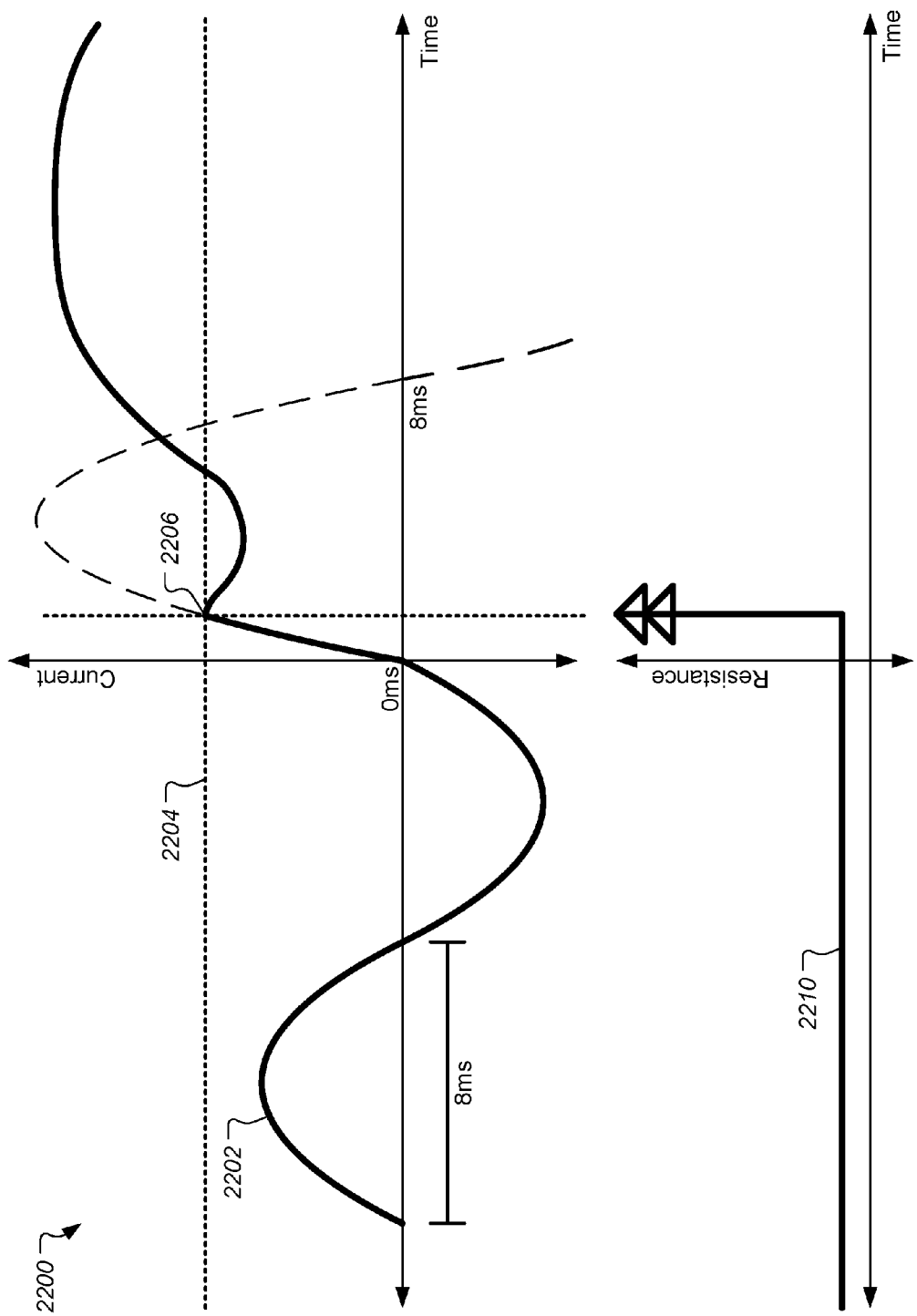
FIG. 22 illustrates current and resistant graphs during an overcurrent detection event when parasitic circuit elements allow current to continue flowing through the SSRs, according to some embodiments.

FIG. 22 illustrates current and resistant graphs during an overcurrent detection event when parasitic circuit elements allow current to continue flowing through the SSRs, according to some embodiments. Curve 2202 shows a current anomaly that exceeds the overcurrent threshold 2204 at time 2206. However, instead of dropping to approximately 0 A, the current represented by curve 2202 drops briefly, then again exceeds the overcurrent threshold 2204 after the resistance represented by curve 2210 increases significantly.

Figure 23:
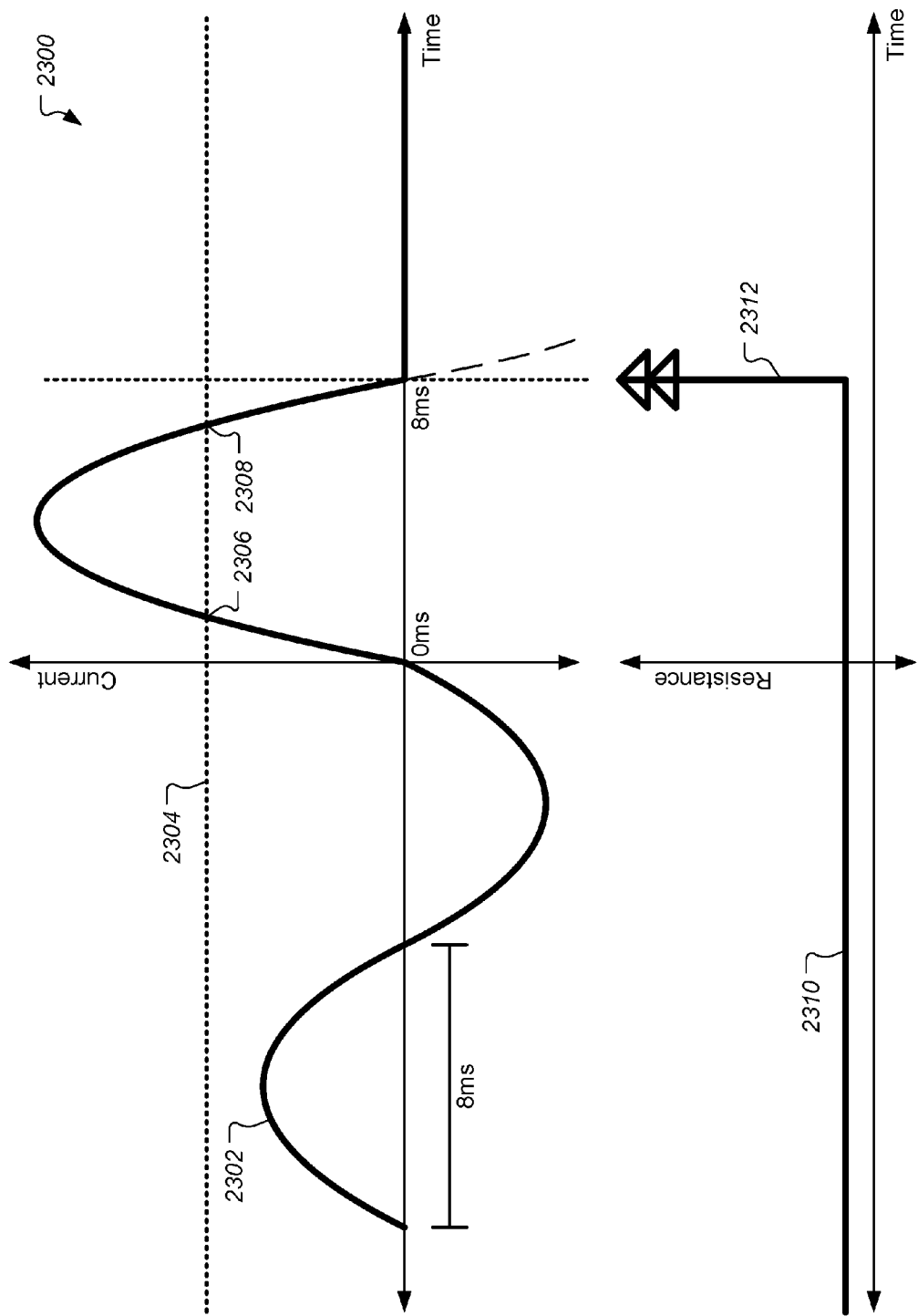
FIG. 23 illustrates current and resistant graphs for an overcurrent anomaly where a delay is added before the SSRs are switched off.

FIG. 23 illustrates current and resistant graphs for an overcurrent anomaly where a delay is added before the SSRs are switched off. In this embodiment, the current represented by curve 2302 again exceeds an overcurrent threshold 2304 at time 2306. However, instead of turning the SSRs off, they are left in a conducting mode until a zero-crossing is detected. Previously, the obvious solution was to immediately turn off the SSRs as soon as an overcurrent anomaly was detected. This was the obvious and surest way to protect the circuitry from damage. However, in some unique environments having inductive loads, the overcurrent anomaly may follow the same AC cycle as the normal current signal. For example, the overcurrent anomaly in a thermostat environment will typically follow the same 60 Hz signal as the 24 VAC signal from the HVAC system. Therefore, some embodiments allow the overcurrent anomaly to persist until a zero crossing is detected, when the SSRs may be safely switched off.

There are at least two characteristics of the inductive load circuits described herein that allow the overcurrent anomaly to persist until a zero crossing is detected without causing damage to the SSRs. First, the 60 Hz signal produces a maximum interval between zero crossings of approximately 8 ms. This is a relatively short amount of time, and the typical silicon circuit can handle the heat generated by the overcurrent anomaly for the 8 ms. Second, by leaving the SSRs on, during the first half cycle of an overcurrent anomaly, the excess power is allowed to dissipate in the transformer of the HVAC system rather than in the SSRs until a zero crossing is detected. Recall from FIG. 17 that the on-resistance of the overcurrent detection module is at least 10 times less than the apparent resistance of the HVAC system. Therefore, by leaving the SSRs on during an overcurrent anomaly, only approximately 10% of the overcurrent power has to be dissipated by the SSR circuits for up to 8 ms.

Figure 24:
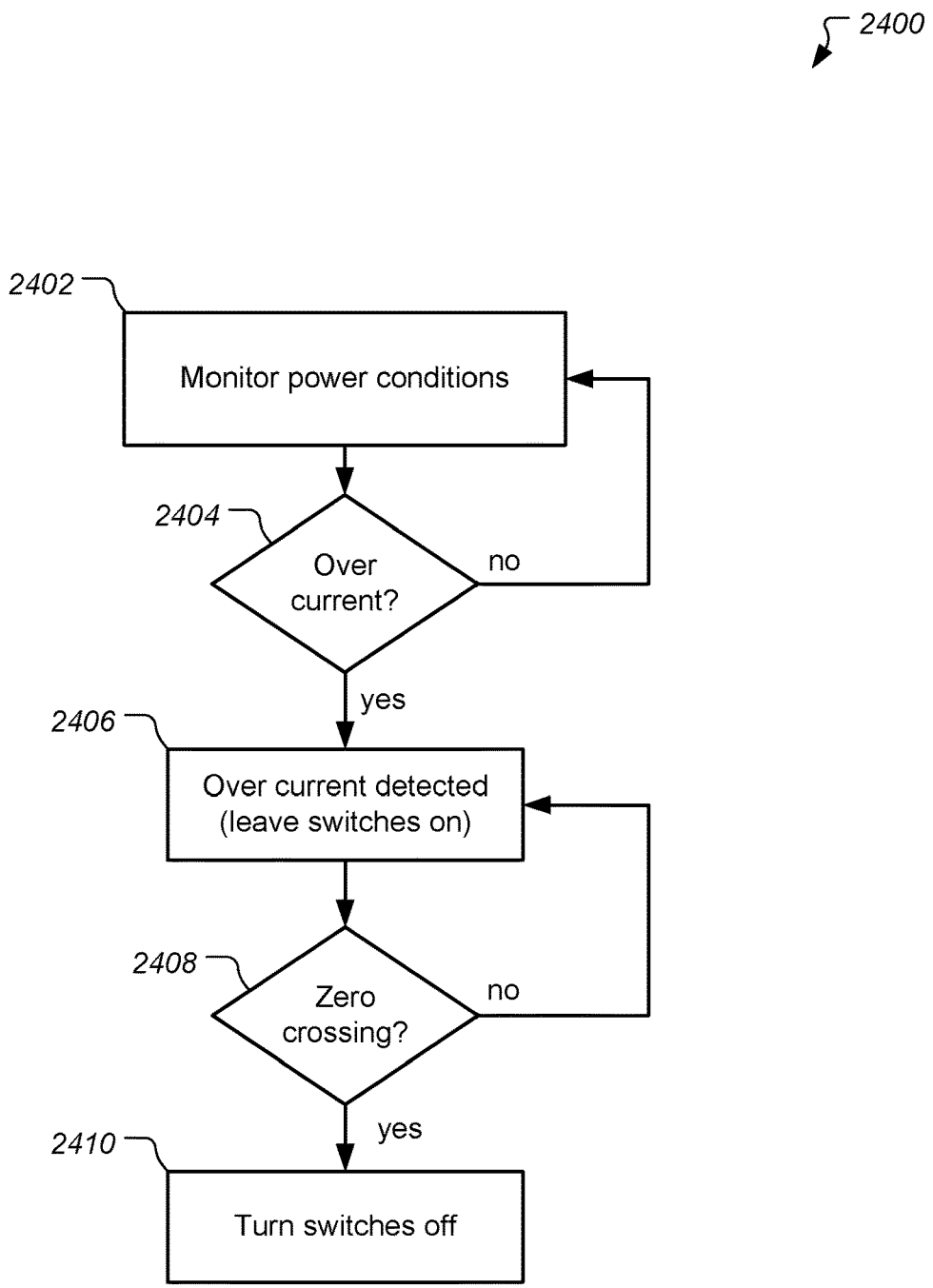
FIG. 24 illustrates a flowchart of a method for handling overcurrent anomalies, according to some embodiments.

FIG. 24 illustrates a flowchart 2400 of a method for handling overcurrent anomalies, according to some embodiments. The method may include monitoring power conditions of the SSR circuits (2402). As described in detail above, monitoring the power conditions may include monitoring a voltage across a pair of transistors, and/or monitoring a current through a pair of transistors. The monitored current/voltage can be compared to a threshold voltage/current using digital/analog comparator circuits.

The method may also include detecting an overcurrent anomaly (2404). The overcurrent anomaly may include an instantaneous current signal that exceeds the overcurrent threshold. In some embodiments, the overcurrent anomaly may include an instantaneous current signal that exceeds the overcurrent threshold for at least a minimum time interval. The method may additionally include, in response to detecting an overcurrent anomaly, leaving one or more switches in an "on," or conducting state (2406). An indication may be stored in the SSR control circuitry that an overcurrent anomaly was detected since the most recent zero-crossing. Note that this allows the SSR circuitry to store the fact that an overcurrent anomaly occurred without taking immediate action to stop conduction of the current through the SSRs.

After the overcurrent anomaly is detected, the method may include detecting a subsequent zero crossing (2408). When a zero crossing is encountered, the method may further include turning the SSRs off into a nonconducting state (2410). In some embodiments, the zero crossing may be either a voltage zero crossing or a current zero crossing. By waiting for the zero crossing, the excessive power of the overcurrent anomaly will be dissipated primarily by the HVAC system. Since the current is at approximately 0 A, the power to be dissipated by either the HVAC system or the SSRs is approximately 0 W. The power dissipated by the SSRs during the at most 8 ms half-AC cycle has been found in experimental embodiments to be well within the dissipation ability of the SSR silicon circuits. For example, some experimental embodiments have been shown to handle temperature increases to up to 150° C. before damaging the SSR circuits. The $I^2R$ power dissipated over the 8 ms was shown to generate far less than an increase of up to 150° C.

Figure 25:
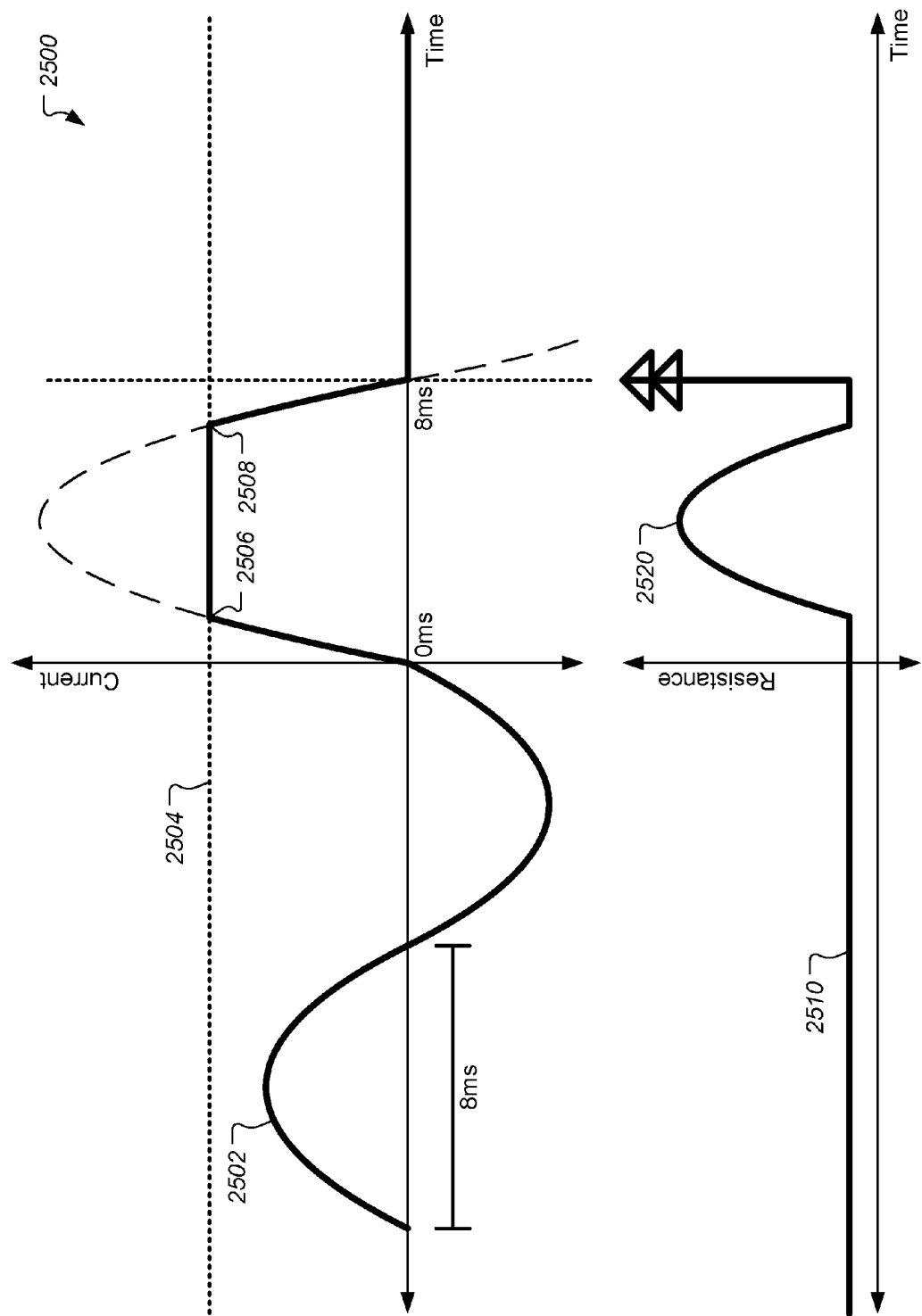
FIG. 25 illustrates current and resistance graphs that dynamically adjust the resistance to maintain a near-threshold current during an overcurrent anomaly, according to some embodiments.

FIG. 25 illustrates current and resistance graphs that dynamically adjust the resistance to maintain a near-threshold current during an overcurrent anomaly, according to some embodiments. In these embodiments, the current represented by curve 2502 once again crosses an overcurrent threshold 2504 at time 2506. However, instead of either turning off the SSRs or simply letting the half cycle resolve without taking any action, these embodiments dynamically increase the on-resistance of the SSR circuit in order to maintain a current that is at or near the overcurrent threshold 2504. The on-resistance represented by curve 2510 illustrates the dynamic increase of on-resistance 2520 that takes place between time 2506 and time 2508. When the current represented by curve 2502 falls below the overcurrent threshold 2504, the on-resistance of the SSR circuit can return to normal until a zero crossing is detected. When a zero crossing is detected, the SSRs can be safely turned off.

Figure 26:
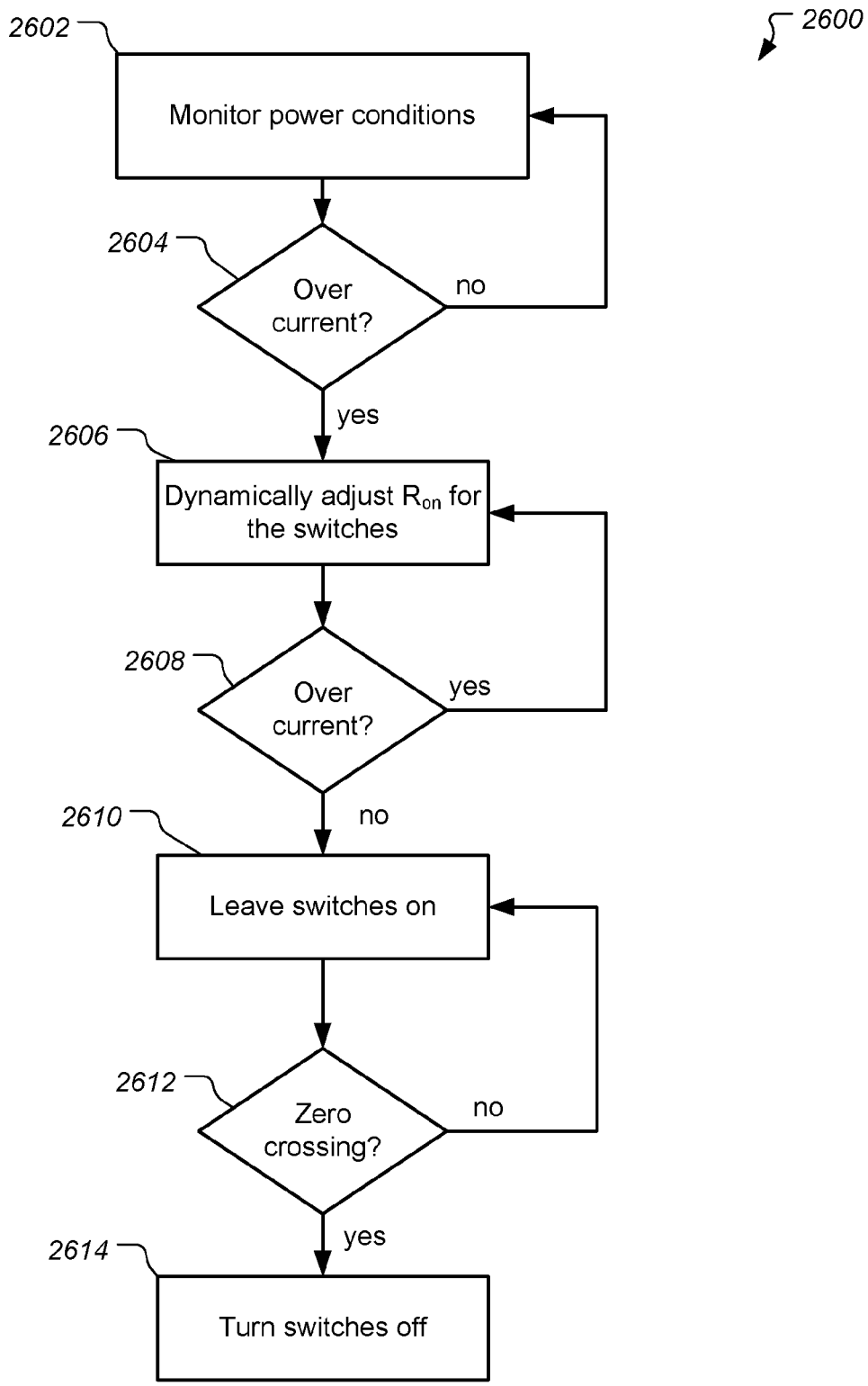
FIG. 26 illustrates a flowchart of a method for handling overcurrent anomalies by adjusting an on resistance, according to some embodiments.

FIG. 26 illustrates a flowchart 2600 of a method for handling overcurrent anomalies by adjusting an on resistance, according to some embodiments. As described above, the method may include monitoring power conditions (2602), and detecting an overcurrent anomaly (2604). The method may then include dynamically adjusting the on-resistance for the SSRs (2606). For example, the on-resistance may be adjusted for MOSFET transistors by adjusting the control voltage applied to the gate of the MOSFET transistors. By lowering the gate voltage, the current passing through the MOSFET can be lowered as the on-resistance of the MOSFET increases. Similarly, by increasing the gate voltage, the current passing through the MOSFET can be increased as the on-resistance of the MOSFET decreases. As the half cycle of the AC current waveform increases to its peak, the voltage on the gate of the MOSFET can be decreased to increase the on-resistance and maintain the current passing through the MOSFET at or near the overcurrent threshold. As the half cycle of the AC current waveform decreases from its peak towards zero, the voltage on the gate of the MOSFET can be increased gradually back to a normal operating level.

The method may also include detecting when a current passing through the SSRs decreases below the overcurrent threshold (2608). In some embodiments, an indication may be stored by the SSR control circuitry that an overcurrent anomaly was detected since the last zero crossing. After the current passes back below the overcurrent threshold, the SSRs can remain in the on state (2610) until a zero crossing is detected (2612), at which point the SSRs can be safely switched off (2614).

Figure 27:
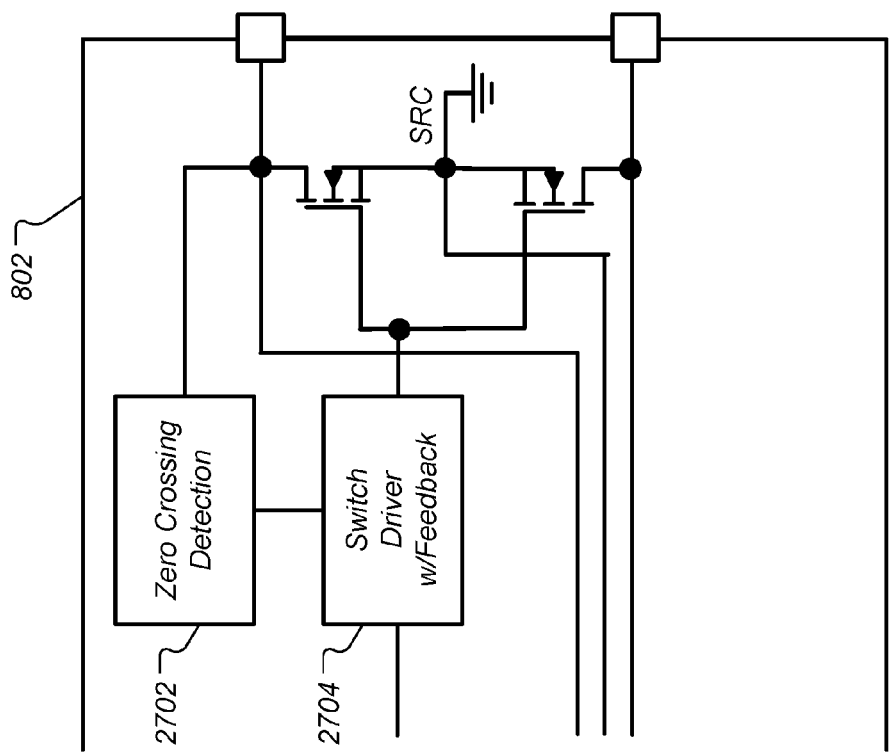
FIG. 27 illustrates a control circuit for a pair of SSRs to dynamically adjust an on-resistance and detect zero crossings, according to some embodiments.

FIG. 27 illustrates a control circuit for a pair of SSRs to dynamically adjust an on-resistance and detect zero crossings, according to some embodiments. The overcurrent detection module 802 described above may be modified to include a zero-crossing detection circuit 2702 configured to monitor a current passing through the SSRs and/or a voltage across the SSRs. The zero-crossing detection circuit 2702 may provide a current measurement to the switch driver circuit 2704. The switch-driver circuit 2704 may include an amplifier that receives the current measurements through the SSRs from the zero-crossing detection circuit 2702 and measures the difference between the measured current and the overcurrent threshold. In response, the switch-driver circuit 2704 can dynamically adjust the gate voltage applied to the SSRs to increase the on-resistance of the SSRs while the measured current is above the overcurrent threshold. A negative feedback element can be provided to the amplifier circuit of the switch-driver circuit 2704 to maintain stability.

It is to be appreciated that although example embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

While the principles of the disclosure have been described above in connection with specific apparatuses and methods, it is to be clearly understood that this description is made only by way of example and not as limitation on the scope of the present teachings.

What is claimed is:

1. A thermostat comprising:
a plurality of wire connectors configured to receive a plurality of wires from an environmental control system, the plurality of wire connectors comprising a call relay wire connector and a power return wire connector;
one or more solid-state switching elements coupled to the call relay wire connector and the power return wire connector, the one or more solid-state switching elements having a first operating state in which the one or more solid-state switching elements create a connection between the call relay wire connector and the power return wire connector, the one or more solid-state switching elements also having a second operating state in which the connection between the call relay wire connector and the power return wire connector is interrupted;
a zero-crossing detection circuit that detects when an electrical signal of the one or more solid-state switching elements is zero; and
power monitoring and control circuitry coupled to the one or more solid-state switching elements and configured to:
cause the one or more solid-state switching elements to operate in the first operating state to actuate at least one environmental control function;
measure the electrical signal of the one or more solid-state switching elements when the one or more solid-state switching elements are operating in the first operating state;
detect an anomaly associated with the electrical signal;
in response to detecting the anomaly, store an indication that the anomaly occurred while continuing to cause the one or more solid-state switching elements to operate in the first operating state;
receive an indication from the zero-crossing detection circuit that the electrical signal of the one or more solid-state switching elements is zero; and
in response to receiving the indication from the zero-crossing detection circuit, cause the one or more solid-state switching elements to operate in the second operating state.

2. The thermostat of claim 1, wherein the power monitoring and control circuitry is further configured to:
after detecting the anomaly, and before receiving the indication from the zero-crossing detection circuit, dynamically adjusting an on-resistance of the one or more solid-state switching elements to maintain the electrical signal of the one or more solid-state switching elements below a predetermined threshold.

3. The thermostat of claim 2, wherein the power monitoring and control circuitry comprises an amplifier that receives electrical signal measurements through the one or more solid-state switching elements, measures a difference between the electrical signal and the predetermined threshold, and dynamically adjusts a control voltage applied to the one or more solid-state switching elements.

4. The thermostat of claim 1, wherein the call relay wire connector and the power return wire connector are connected to an inductive load of the environmental control system.

5. The thermostat of claim 4, wherein an on-resistance of the one or more solid-state switching elements is at least 10 times a resistance of the inductive load of the environmental control system.

6. The thermostat of claim 1, wherein the power monitoring and control circuitry comprises:
a first integrated circuit (IC) comprising a microprocessor; and
a second IC comprising power monitoring circuitry, the one or more solid-state switching elements, and a drive circuit for the one or more solid-state switching elements.

7. The thermostat of claim 6, wherein the second IC is isolated from other circuitry in the thermostat through one or more isolation capacitors, wherein the second IC and the first IC communicate with each other using clocked pulses.

8. The thermostat of claim 7, wherein the second IC is powered by the clocked pulses provided by the first IC.

9. The thermostat of claim 1, wherein the anomaly associated with the electrical signal comprises a current running through the one or more solid-state switching elements exceeding a threshold of approximately 4.0 A.

10. The thermostat of claim 1, wherein the one or more solid-state switching elements comprises a pair of complementary metal-oxide semiconductor field-effect transistors.

11. A method of responding to electrical anomalies by a thermostat, the method comprising:
- causing one or more solid-state switching elements of the thermostat to operate in a first operating state to actuate at least one environmental control function, wherein:
  - the one or more solid-state switching elements are coupled to a call relay wire connector and a power return wire connector of the thermostat;
  - the one or more solid-state switching elements are configured to operate in the first operating state in which the one or more solid-state switching elements create a connection between the call relay wire connector and the power return wire connector; and
  - the one or more solid-state switching elements are configured to operate in a second operating state in which the connection between the call relay wire connector and the power return wire connector is interrupted;
- measuring an electrical signal of the one or more solid-state switching elements when the one or more solid-state switching elements are operating in the first operating state;
- detecting an anomaly associated with the electrical signal;
- in response to detecting the anomaly, storing an indication that the anomaly occurred while continuing to cause the one or more solid-state switching elements to operate in the first operating state;
- receiving an indication from a zero-crossing detection circuit that the electrical signal of the one or more solid-state switching elements is zero; and
- in response to receiving the indication from the zero-crossing detection circuit, causing the one or more solid-state switching elements to operate in the second operating state.

12. The method of claim 11, wherein power monitoring and control circuitry of the thermostat comprises a first terminal and a second terminal associated with the one or more solid-state switching elements, wherein the anomaly is detected by monitoring a voltage difference between the first terminal and the second terminal.

13. The method of claim 11, wherein power monitoring and control circuitry of the thermostat is further configured to send an indication of the anomaly to a remotely-located thermostat monitoring server.

14. The method of claim 11, further comprising, after detecting the anomaly, and before receiving the indication from the zero-crossing detection circuit, dynamically adjusting an on-resistance of the one or more solid-state switching elements to maintain the electrical signal between the call relay wire connector in the power return wire connector below a predetermined threshold.

15. The method of claim 14, wherein power monitoring and control circuitry of the thermostat comprises an amplifier that receives electrical signal measurements through the one or more solid-state switching elements, measures a difference between the electrical signal and the predetermined threshold, and dynamically adjusts a control voltage applied to the one or more solid-state switching elements.

16. The method of claim 11, wherein the call relay wire connector and the power return wire connector are connected to an inductive load of the environmental control system.

17. The method of claim 16, wherein an on-resistance of the one or more solid-state switching elements is at least 10 times a resistance of the inductive load of the environmental control system.

18. The method of claim 11, wherein power monitoring and control circuitry of the thermostat comprises:
- a first integrated circuit (IC) comprising a microprocessor; and
- a second IC comprising power monitoring circuitry, the one or more solid-state switching elements, and a drive circuit for the one or more solid-state switching elements.

19. The method of claim 18, wherein the second IC is isolated from other circuitry in the thermostat through one or more isolation capacitors, wherein the second IC and the first IC communicate with each other using clocked pulses.

20. The method of claim 19, wherein the second IC is powered by the clocked pulses provided by the first IC.

* * * * *